(12) United States Patent  (10) Patent No.: US 7,674,083 B2
Miyajima et al.  (45) Date of Patent: Mar. 9, 2010

(54) CLEAN DEVICE WITH CLEAN BOX-OPENING/CLOSING DEVICE

(75) Inventors: Toshihiko Miyajima, Tokyo (JP); Shigeki Ishiyama, Tokyo (JP)

(73) Assignee: TDK Corporation, Tokyo (JP)

( * ) Notice: Subject to any disclaimer, the term of this patent is extended or adjusted under 35 U.S.C. 154(b) by 721 days.

(21) Appl. No.: 10/556,723

(22) PCT Filed: May 11, 2004

(86) PCT No.: PCT/JP2004/006604

§ 371 (c)(1),
(2), (4) Date: Nov. 16, 2006

(87) PCT Pub. No.: WO2004/102655

PCT Pub. Date: Nov. 25, 2004

(65) Prior Publication Data

US 2007/0080096 A1    Apr. 12, 2007

(30) Foreign Application Priority Data

May 15, 2003  (JP) ............................. 2003-137026
May 30, 2003  (JP) ............................. 2003-154078

(51) Int. Cl.
    *B65G 1/133* (2006.01)
(52) U.S. Cl. .................. 414/217.1; 414/220; 414/411; 414/940
(58) Field of Classification Search ............. 414/220, 414/217.1, 411, 940; 49/373, 464; 432/250; 141/383
    See application file for complete search history.

(56) References Cited

U.S. PATENT DOCUMENTS

| 4,532,970 A | 8/1985 | Tullis et al. |
| 4,674,936 A | 6/1987 | Bonora |
| 4,676,709 A | 6/1987 | Bonora et al. |
| 4,724,874 A | 2/1988 | Parikh et al. |

(Continued)

FOREIGN PATENT DOCUMENTS

JP    4 505234    9/1992

(Continued)

OTHER PUBLICATIONS

U.S. Appl. No. 12/411,767, filed Mar. 26, 2009, Miyajima, et al.

(Continued)

*Primary Examiner*—Michael S Lowe
(74) *Attorney, Agent, or Firm*—Oblon, Spivak, McClelland, Maier & Neustadt, L.L.P.

(57) ABSTRACT

In a load port portion of a conventional clean device, it can happen that cleanliness is reduced by dust caused by wear of bellows and a lid is not separated by its weight from a main body. In order to solve such problems, a clean device is structured as follows: a lid of a clean box has a non-circular reception hole, a load port portion of the clean device has an opening/closing mechanism with a projection fittable in the receiving hole and has a buffer chamber, one end of bellows of the buffer chamber is connected to the bottom surface of the buffer chamber, and the other end of the bellows is fixed, on the outside of the buffer chamber, to raising/lowering means of a port door.

6 Claims, 19 Drawing Sheets

U.S. PATENT DOCUMENTS

| | | |
|---|---|---|
| 4,995,430 A | 2/1991 | Bonora et al. |
| 5,169,272 A | 12/1992 | Bonora et al. |
| 5,370,491 A | 12/1994 | Bonora et al. |
| 5,547,328 A | 8/1996 | Bonora et al. |
| 5,611,452 A | 3/1997 | Bonora et al. |
| 5,697,750 A | 12/1997 | Fishkin et al. |
| 5,713,711 A | 2/1998 | McKenna et al. |
| 5,740,845 A | 4/1998 | Bonora et al. |
| 5,957,292 A | 9/1999 | Mikkelsen et al. |
| 6,000,732 A | 12/1999 | Scheler et al. |
| 6,082,948 A | 7/2000 | Fishkin et al. |
| 6,216,873 B1 | 4/2001 | Fosnight et al. |
| 6,326,614 B1 | 12/2001 | Bacchi et al. |
| 6,352,403 B1 | 3/2002 | Fishkin et al. |
| 6,364,595 B1 | 4/2002 | Bonora et al. |
| 6,419,482 B1 | 7/2002 | Sakata et al. |
| 6,501,070 B1 | 12/2002 | Bacchi et al. |

FOREIGN PATENT DOCUMENTS

| | | |
|---|---|---|
| JP | 6 268046 | 9/1994 |
| JP | 6 275699 | 9/1994 |
| JP | 6-275703 | 9/1994 |
| JP | 8 1923 | 1/1996 |
| JP | 2525284 | 5/1996 |
| JP | 2722306 | 11/1997 |
| JP | 10-56050 | 2/1998 |
| JP | 2757102 | 3/1998 |
| JP | 2850279 | 11/1998 |
| JP | 2864458 | 12/1998 |
| JP | 2960540 | 7/1999 |
| JP | 11 354602 | 12/1999 |
| JP | 3084827 | 7/2000 |
| JP | 2000 315724 | 11/2000 |
| JP | 2001-15576 | 1/2001 |
| JP | 2001 15583 | 1/2001 |
| JP | 3167970 | 3/2001 |
| JP | 2001 203253 | 7/2001 |
| JP | 2003-77998 | 3/2003 |
| WO | WO 01/06560 A1 | 1/2001 |

OTHER PUBLICATIONS

U.S. Appl. No. 12/389,541, filed Feb. 20, 2009, Emoto, et al.

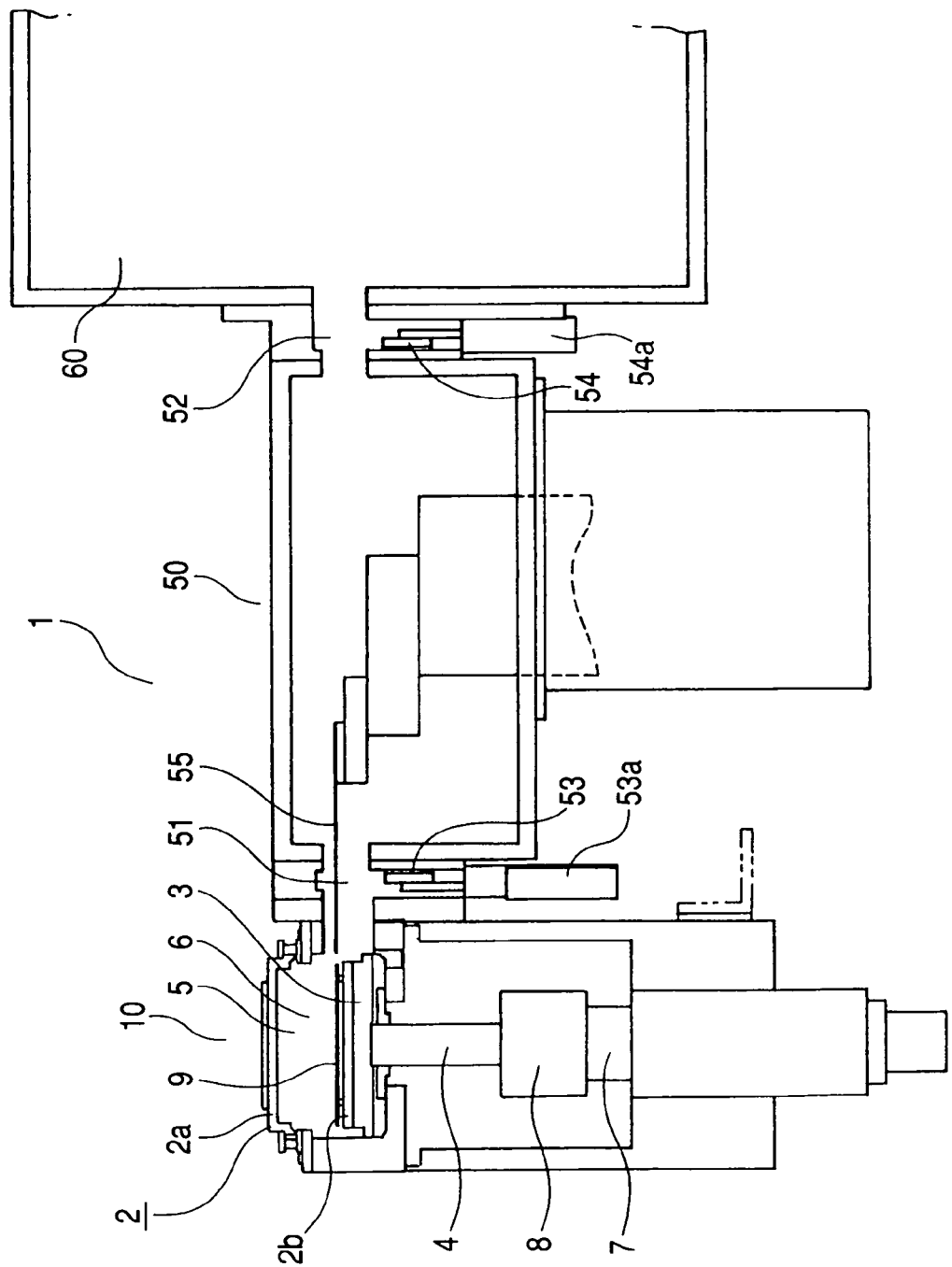

CLEAN DEVICE WITH CLEAN BOX-OPENING/CLOSING DEVICE

TECHNICAL FIELD

The present invention relates to an opening/closing mechanism for opening and closing a lid of an SMIF-type clean box, and to a load port portion of a clean device having the opening/closing mechanism in a substrate processing device, in which a substrate, such as a substrate of a semiconductor product or the like as an object for a processing requiring high cleanliness, is accommodated in the clean box and sealed up by its lid and main body so as to ensure high cleanliness inside. The substrate processing device loads/unloads the substrate into/from the clean box. In loading and unloading the substrate, the lid is vertically moved to be opened and closed.

The present invention also relates to an article accommodating container for accommodating an article to be processed in a highly clean environment such as a semiconductor, a panel for a flat panel display, or an optical disk, and various articles used together with that article, during a manufacturing process thereof. More specifically, the present invention also relates to the structure of a main body of the article accommodating container having an opening portion located at vertical side and to the structure of a lid for closing the opening portion.

BACKGROUND ART

The processing of a substrate of a semiconductor product or the like needs to be carried out in an environment in which high cleanliness is ensured. In general, the processing is carried out in a clean room that is entirely kept highly clean. However, heavy investment in facilities and immense expenses of maintenance are required in order to keep the entire room having a large cubic volume highly clean. Even after an investment in facilities has been made, further heavy investment in facilities would be needed in changing the layout of the room associated with a change in manufacturing process, which is not economical.

Further, substrates such as silicon wafers have been increasing in size, so such a measure is problematic in terms of the cost to ensure a required clean environment.

In view of the above, a method as disclosed in the specification of Japanese Patent No. 3167970 has been known in recent years, according to which the inside of a substrate processing device (hereinafter referred to as a clean device) for processing a substrate such as a semiconductor is kept highly clean as a micro environmental space (hereinafter referred to as a mini-environment portion), instead of keeping the entire room highly clean, thereby achieving the same effect as in the case where the entire room is kept highly clean.

That is, the substrate processing device is laid out in a room where substrates are manufactured, and a substrate storing container (hereinafter referred to as a clean box) whose inside is kept highly clean is used to transfer substrates into and from the clean device. Then, the clean box is coupled to a predetermined substrate gateway provided in the substrate processing device so as to prevent the entrance of dust from the outside. If substrates are transferred via the predetermined gateway, the entire environment to which those substrates are exposed can be kept highly clean without enhancing the cleanliness of the room where those substrates are manufactured. Thus, the same effect as in the case where the entire room is turned into a clean room can be achieved. As a result, an efficient production process can be realized by cutting down on the amount of investment in facilities and the expense of maintenance. In this specification, a substrate should be construed to include, for example, an exposure mask (reticle), a semiconductor wafer. Therefore, a substrate processing device should be construed to include a reticle processing device and a semiconductor wafer processing device.

A pod having an opening portion in a vertically lower side as described above and adapted to open and close the opening portion by vertically moving a lid is generically referred to as a standard mechanical interface (SMIF) type pod. The present invention relates to this SMIF type pod. As described above, an efficient production process is realized while reducing the amount of investment in facilities and the expense of maintenance and achieving the same effect as in the case where an entire plant is turned into a clean room, by adopting a so-called mini-environment method in which only limited space is kept highly clean.

A clean device 1 will be described with reference to FIG. 9. FIG. 9 is a view showing a cross-section of the entire clean device 1. The clean device 1 is provided with a processing room 60, a transfer room 50, and a load port portion 10.

Various substrate processings to be carried out in the clean device 1 are carried out in the processing room 60.

The transfer room 50 has therein a sealed-up space shut off from the outside. A robot arm 55 for transferring substrates is arranged in the transfer room 50.

A clean box 2 is laid on the load port portion 10 to transfer substrates into the processing room 60 of the clean device 1. The load port portion 10 has a function of removing a lid 2b from a main body 2a of the clean box 2.

A port door 3 that is substantially horizontally held is arranged in the load port portion 10. The port door 3 is raised and lowered vertically (see, Japanese Patent Application Laid-open No. 2001-203253). Referring to FIG. 9, the port door 3 is in its lowered state. The port door 3 is surrounded by wall surfaces surrounding the port door 3 on all four sides and a bottom portion located substantially parallel to a lower face of the port door 3. The wall surfaces and the bottom portion constitute a buffer chamber 6 inside the load port portion 10. The buffer chamber 6 is open at its top, thus constituting an access opening 5 that is substantially equal in size to the port door 3. Therefore, when viewed from the access opening 5, there is formed the buffer chamber 6 having a predetermined depth. The size of the access opening 5 is substantially equal to or smaller than that of an envelope region of an opening of the clean box 2. The port door 3 is raised and lowered along the wall surfaces of the buffer chamber 6. The access opening 5 is covered with the main body 2a of the clean box 2 as shown in FIG. 9 when the clean box 2 is laid on the load port portion 10. The buffer chamber 6 of the load port portion 10 remains sealed up even when the lid 2b is removed.

In this example, a pod 2 accommodates, instead of a substrate, a photomask called a reticle used in a semiconductor processing process. The inside of the pod 2 is filled with a gas such as dry nitrogen which is usually kept highly clean, when an article is accommodated therein. Using this gas, the pressure inside the pod 2 is thus held equal to or higher than an atmospheric pressure to thereby reduce the possible internal contamination resulting from an ambient environment.

The buffer chamber 6 in the load port portion 10 and an inside 50a of the transfer room 50 communicate with each other through a transfer opening 51. The inside 50a of the transfer room 50 and an inside 60a of the processing room 60 communicate with each other through a transfer opening 52. The inside of the load port portion 10, the inside 50a of the transfer room 50, and the inside of the processing room 60 are sealed up to be shut off from the external environment, thus forming a mini-environment portion.

Further, the transfer opening 51 is opened and closed by an opening/closing door 53 driven by an opening/closing gate valve 53a. On the other hand, the transfer opening 52 is opened and closed by an opening/closing door 54 driven by an opening/closing gate valve 54a.

Referring now to FIG. 10, the load port portion 10 will be described in detail. FIG. 10 is a view showing the load port portion 10 of FIG. 9 on an especially enlarged scale. As shown in FIG. 10, the port door 3 is in its raised state unlike in the case of FIG. 9. Referring to FIG. 10, the lid 2b is laid on the port door 3. Note that, the port door 3 in its lowered state is indicated by a chain double-dashed line in FIG. 10. Raising/lowering means 4 is connected to the port door 3. The raising/lowering means 4 is provided with a latch opening/closing shaft 4a, a frame 4b for holding an actuator within the latch opening/closing shaft, a raising/lowering shaft 4c, and an electric actuator 7. The latch opening/closing shaft 4a is a vertically extending rod-like member that is joined at one end thereof to the lower face as an inner face of the port door 3, thus serving to directly transmit a raising/lowering movement of the raising/lowering means 4 to the port door 3. The latch opening/closing shaft 4a is joined at the other end thereof, which is located on the side opposite to the port door 3, to the frame 4b. The frame 4b is connected to the raising/lowering shaft 4c. The raising/lowering shaft 4c is connected to the electric actuator 7. Thus, the raising/lowering means 4 causes a raising/lowering movement of the port door 3. A through-hole through which the latch opening/closing shaft 4a extends is arranged at a lower center of the buffer chamber 6. The size of the through-hole is substantially equal to or smaller than that of the latch opening/closing shaft 4a.

A rotary shaft 33 rotatable around a center of the latch opening/closing shaft 4a is mounted therein. Rod-like latch pins 32 arranged so as to protrude vertically from the surface of the port door 3 are arranged at a tip of the rotary shaft 33. The latch pins 32 are arranged at arbitrary positions on a circumference of a circle spreading around a rotation axis of the rotary shaft 33. It is preferable that the latch pins 32 be circular holes arranged point-symmetrically on the circumference of the circle.

The port door 3 is a rectangular flat plate substantially corresponding in shape to the access opening 5. When being raised, the port door 3 is fittingly inserted into the access opening 5 and closes it as shown in FIG. 10, thus sealing up the buffer chamber 6 and shutting it off from the external world. A positioning pin 3c as a protrusion, which protrudes from a top face of the port door 3 substantially perpendicularly thereto, is arranged on the top face side of the port door 3 corresponding to the outer face side of the load port portion 10 so as to position the lid 2b of the clean box 2. A hole corresponding to the positioning pin 3c extends through the lid 2b of the clean box 2. When the clean box 2 is laid on the load port portion 10 and the port door 3 is raised to abut on the lid 2b of the clean box 2, the positioning pin 3c is fittingly inserted into the hole so that the lid 2b is located at a right position with respect to the port door 3.

A lower portion of the port door 3 constitutes a flange-like brim 3a that is larger than the access opening 5. A sealing member 3b is fitted in the brim 3a. When the electric actuator 7 is driven to raise the latch opening/closing shaft 4a to thereby fittingly insert the port door 3 into the access opening 5, the brim 3a comes into abutment with an edge portion 5a of the access opening 5, thereby sealing up the buffer chamber 6. On the other hand, conversely, when the electric actuator 7 is driven to lower the latch opening/closing shaft 4a to thereby lower the port door 3, the access opening 5 opens widely.

A bellows 31 is so fitted as to range from a lower face of the port door 3 to at least an outer periphery of the latch opening/closing shaft 4a in the buffer chamber 6 (e.g., see Japanese Patent Application Laid-open No. 2001-203253 or Japanese Patent Application Laid-open No. 06-268046). When the electric actuator 7 is driven to raise the latch opening/closing shaft 4a, the bellows 31 expands because the port door 3 moves away from the bottom face. When the electric actuator 7 is driven to lower the latch opening/closing shaft 4a, the bellows 31 contracts because the port door 3 moves toward the bottom face.

A measure against falloff of the lid 2b from the main body 2a of the clean box 2 during transfer is taken by means of a latch mechanism. FIG. 11 shows a latch mechanism inside the lid 2b.

A conventional latch mechanism typically has the following structure. A rotatably arranged circular rotary cam plate 21 is rotatably located substantially at a central position of the lid 2b. Latch holes 21a located at arbitrary positions on a circumference of a circle spreading around a center of the rotary cam plate 21 are formed therethrough. Note that the latch holes 21a are preferably circular holes arranged point-symmetrically on the circumference of the circle. The latch pins 32 engage the latch holes 21a. The latch holes 21a are shaped so as to receive the latch pins 32 therein, and are so arranged as to correspond in position to the latch pins 32.

Arranged outside the latch holes 21a of the rotary cam plate 21 are two cam grooves 23, which are point-symmetrical to each other with respect to the center of the rotary cam plate 21. Given that each of the cam grooves 23 has one end as a starting point 23a and the other end as an end point 23b, the distance between the starting point 23a of the cam groove 23 and the center of the rotary cam plate 21 is the shortest, whereas the distance between the center of the cam groove 23 on the end point 23b side of the cam groove 23 and the center of the rotary cam plate 21 is the longest. On the other hand, the lid 2b has a latch member 26 movable parallel to the plane of the lid 2b. A driven pin 24 is arranged on the rotary cam plate 21 side of the latch member 26. The driven pin 24 is engaged with the cam groove 23. The latch member 26 includes a tip portion protruding from a lateral face of the lid 2b.

Now, when the latch pins 32 arranged at the tip of the rotary shaft 33 in the latch opening/closing shaft 4 of the port door 3 on which the lid 2b is laid are fittingly inserted into the latch holes 21a and the rotary cam plate 21 is rotated by rotating the rotary shaft 33, the driven pin 24 of the latch pin 26 moves along the cam groove 23b from its starting point 23a toward its end point 23b. In accordance therewith, the position of the driven pin 24 moves from the center of the rotary cam plate 21 toward the outside thereof. In accordance with a moving distance of the driven pin 24, a tip portion 22a of the latch member 26 moves toward the outside of the lid 2b. The latch member 26 is set to be confined within the lid 2b when the driven pin 24 is located at the starting point 23a, and to protrude from the lid 2b when the driven pin 24 is located at the end point 23b. On the other hand, a latch hole 30 for engagement with the latch member 26a is arranged at the position where the latch hole 30 abuts on the lid 2b for the main body 2a of the clean box 2, so the lid 2b can be fixed to the clean box 2 by rotating the rotary cam plate 21.

The rotatable latch pins 32 for engaging the cam grooves 23 of the rotary cam plate 21 are arranged as an opening/closing mechanism on the top face of the port door 3. The latch pins 32 are coupled to the rotary shaft 33 arranged within the latch opening/closing shaft 4a. The rotary shaft 33 is coupled to a rotary actuator 34 as rotation means.

Next, how a substrate 9 is exchanged between the load portion 10, the transfer room 50, and the processing room 60 in the clean device 1 will be described.

The clean box 2 is first laid on the load port portion and fixed as shown in FIG. 9. At this moment, the substrate 9 is laid on the lid 2b. When the latch opening/closing shaft 4a is raised by driving the electric actuator 7, the port door 3 is raised while the bellows 31 expands, and the latch pins 32 protruding from the top face of the port door 3 are fittingly inserted into the latch holes 21a. Then, the port door 3 comes into abutment with the lid 2b of the clean box 2. When the rotary actuator 34 is rotated at this stage, the rotary shaft 33 rotates. In response thereto, the latch pins 32 press the edges of the latch holes 21a, thus causing the rotary cam plate 21 to rotate. When the rotary cam plate 21 rotates, the driven pin 24 rotates and the latch member 26 is confined within the door 2b. In this state, the lid 2b fixed to the main body 2a of the clean box 2 is then released therefrom.

When the electric actuator 7 is then driven to lower the latch opening/closing shaft 4a, the port door 3 is also lowered while the bellows 31 contracts. The lid 2b moves due to its own weight away from the main body 2a of the clean box 2 as the port door 3 is lowered. After the port door 3 has been completely lowered, the lid 2b on which the substrate 9 is laid is located on a bottom portion of the buffer chamber 6. In this state, the robot arm 55 can then perform a transfer operation.

The buffer chamber 6 in the load port portion 10 and the inside 50a of the transfer room 50 communicate with each other through the transfer opening 51, and the inside 50a of the transfer room 50 and the inside 60a of the processing room 60 communicate with each other through the transfer opening 52. The inside of the load port portion 10, the inside 50a of the transfer room 50, and the inside of the processing room 60 are sealed up and shut off from the external environment, thus forming a mini-environment portion.

When the opening/closing gate valve 53a is driven to open the opening/closing door 53, the buffer chamber 6 in the load port portion 10 and the inside 50a of the transfer room 50 communicate with each other. The substrate 9 is transferred from the buffer chamber 6 in the load port portion 10 by operating the robot arm 55. Furthermore, the inside 50a of the transfer room 50 and the inside 60a of the processing room 60 communicate with each other by driving the opening/closing gate valve 54a to open the opening/closing door 54. The substrate 9 is transferred from the transfer room 50 into the processing room 60 by operating the robot arm 55.

Note that included in related art documents about the above-described constructions are Japanese Patent No. 3084827 and Japanese Patent No. 2960540 as well as the aforementioned Japanese Patent Application Laid-open No. 2001-203253 and Japanese Patent Application Laid-open No. 06-268046.

In an SMIF type container, a latch member arranged on a lid or a tip portion of the latch member engages a hole or a groove formed in a main body of a pod, so that the lid is fixed to the main body of the pod. That is, this fixation is accomplished when the latch member comes into contact with a latch member receiving face formed on the main body, and a load toward a central portion of the lid and a load toward the main body are applied from the latch member receiving face to the latch member. In this case, as described in Japanese Patent No. 3167970 as well, a physical "rub" occurs between the surface of the latch member and the latch member receiving face so as to obtain the aforementioned loads, which may result in generation of particles. As far as a single operation is concerned, such particles are generated with very low frequency. However, in a working process consisting of several tens of steps or more, a considerable amount of particles may be generated.

In order to reduce the factors for generation of such particles, according to the aforementioned Japanese Patent No. 2960540, two cam faces acting in different directions are provided for a latch member. That is, a latch tip portion moves without coming into contact with a latch receiving face in advancing or retreating with respect to an inside of a main body portion such as a groove. The latch tip portion moves substantially perpendicularly to the latch receiving face in the process of engagement. Therefore, in the construction disclosed in the above document, the latch tip portion and the latch receiving face seldom rub each other. Accordingly, with this construction, it seems possible to suppress the generation of particles resulting from the rubbing of the latch tip portion which has been conventionally deemed problematic. However, the latch tip portion usually operates as a fulcrum for pressing the entire lid against the main body portion. Therefore, as is the case with the foregoing construction, loads tend to converge on a contact point when this contact point is obtained by a movement of the latch tip portion in the direction substantially perpendicular to the latch receiving portion. As a result of the convergence of the loads, there may occur a serious local abrasion. In this case, the generation of particles due to a cause slightly different from those of conventional cases seems to raise a problem.

Note that, the pressure inside a pod and the pressure inside a buffer chamber in a load port are generally held equal to or higher than an atmospheric pressure by means of a clean gas. Thus, even when the aforementioned particles and the like are generated, they hardly enter the inside of the pod or the like. Thus, even with the construction disclosed in Japanese Patent No. 2960540, it is possible to achieve an effect of reducing the amount of particles to some extent. However, in the case of an SIMF type container used for a specific purpose such as accommodation of a reticle, the inside of a pod is usually maintained in a depressurized state, and an operation of taking out the reticle as an accommodated article is also performed with the inside of a buffer chamber depressurized. In this case, generated particles are extremely likely to enter the inside of the pod or the like.

In consideration of the foregoing circumstances, there is known a construction in which a vacuum space is formed on a lid face on a main body side instead of employing a latch mechanism and the atmospheric pressure applied to the lid due to the existence of the vacuum space is used to ensure tight contact between the lid and the main body and seal up of an inner space. This construction eliminates the necessity of a latch mechanism, so it is absolutely unnecessary to consider the generation of particles resulting from the mechanism. In this construction, the lid is unlikely to fall off even when the pressure in the vacuum space has become equal to the atmospheric pressure for some reason, as long as the construction is applied to a container having an opening in its lateral face, such as a so-called FOUP. It is also relatively easy to cope with such a situation. However, a vacuum break in the space can cause the lid to fall off when the above-described construction is applied to a container having an opening in its vertically lower face, such as an SMIF type pod, so it is desirable to take an appropriate measure. In this case, when the above-mentioned latch mechanism is employed as a corresponding measure, the amount of the aforementioned particles needs to be reduced as well.

DISCLOSURE OF INVENTION

As described above, the conventional clean device 1 has the following problems.

(1) Although the opening/closing mechanism arranged on the port door 3 of the load port portion 10 in the conventional clean device 1 releases the latch mechanism serving as a device for fixing the lid 2b, it simply holds the lid 2b itself and does not forcibly remove the lid 2b from the main body 2a of the clean box 2 while keeping the lid 2b fixed to the port door 3. The lid 2b is supposed to move spontaneously, due to its own weight away from the main body 2a of the clean box 2.

This is because of the following reasons. Usually, the internal pressure of the clean box 2 is substantially equal to the atmospheric pressure, even in the state in which the inside of the clean box 2 is filled with an inactive gas. Also, the lid 2b itself, including the substrate 9, is heavy enough to move spontaneously away from the clean box 2a owing to the gravity.

However, in the case of processing a substrate, in particular a reticle, the entire clean device 1 including the processing room 60 and the transfer room 50 needs to be kept not only highly clean but also vacuum. In addition, the inside of the clean box 2 also needs to be kept vacuum. In such a case, the weight of the lid 2b may not allow the lid 2b to move away from the main body 2a of the clean box 2. Further, as the sealing effect of a sealing material arranged at a joint between the main body 2a and the lid 2b of the clean box 2 for maintaining a vacuum state increases, the tightness of contact between the sealing member and the clean box 2 improves and the lid 2b becomes more unlikely to fall off the clean box 2. This tendency is noticeable particularly, for example, in the case where the substrate 9 is not laid.

(2) In the load port portion 10 in the conventional clean device 1, the bellows 31 is mounted in the buffer chamber 6 between the lower face of the port door 3 and the bottom portion of the buffer chamber 6. The buffer chamber 6 is evacuated when the port door 3 is lowered. However, abrasion of the bellows 31 resulting from its expansion/contraction produces dust, which causes a problem of a decrease in the degree of cleanliness in the buffer chamber 6.

To solve the above-mentioned problems, the present invention provides a clean device including a lid and a main body and having an inside environment kept cleaner than an outside environment to receive a substrate from a clean box, which is kept highly clean inside and has the substrate stored in the inside, and process the substrate, characterized in that: the clean device includes a load port portion equipped with an opening/closing mechanism having a turnable latch pin to separate the lid from the main body or couple the lid to the main body with the clean box laid thereon; the lid of the clean box has: a cam plate capable of engaging with the latch pin and actuating in accordance with a turning movement of the latch pin; and a latch member protruding to an outside of the lid to engage a latch hole of the main body of the clean box or being confined within the lid to be released from the latch hole of the main body of the clean box in accordance with an actuation of the cam plate; the lid of the clean box further includes a non-circular receiving hole; the opening/closing mechanism further includes a protrusion that can be fittingly inserted into the receiving hole; the latch pin becomes capable of engaging the cam plate and the protrusion of the opening/closing mechanism is fittingly inserted into the lid of the clean box when the clean box is laid on the load port; and the protrusion and the receiving hole become capable of engaging with each other in accordance with a turning movement of the latch pin. This makes it possible for the port door to fix the lid in the clean device. Thus, the lid can be positively moved away from the main body of the clean box not solely due to the weight of the lid itself.

Further, to solve the above-mentioned problems, the present invention provides a clean device including a lid and a main body and having an inside environment kept cleaner than an outside environment to receive a substrate from a clean box, which is kept highly clean inside and has the substrate stored in the inside, and process the substrate, characterized in that: the clean device includes a load port portion for separating the lid from the main body or coupling the lid to the main body with the clean box laid thereon, to receive the substrate from the clean box; the load port portion includes: a port door that is raised and lowered and has one face on which the lid is laid; a buffer chamber defined by wall surfaces arranged surrounding an outer periphery of the port door in a region where the port door is raised and lowered, and by a bottom face arranged opposed to the other face of the port door; raising/lowering means joined to the port door, for raising and lowering the port door along a direction perpendicular to the face of the port door; and a bellows arranged along an outer periphery of the raising/lowering means; the bellows is coupled at one end thereof to the bottom face of the buffer chamber; and the bellows is fixed at the other end thereof to the raising/lowering means outside the buffer chamber. That is, the port door can be raised and lowered in the clean box without producing dust.

Further, the present invention also provides a method in which a clean device including a lid and a main body and having an inside environment kept cleaner than an outside environment to receive a substrate from a clean box, which is kept highly clean inside and has the substrate stored in the inside, and process the substrate, is used to separate the lid from the main body of the clean box to prepare for extraction of the substrate, characterized in that: the clean device includes a load port portion equipped with an opening/closing mechanism having a turnable latch pin to separate the lid from the main body or couple the lid to the main body with the clean box laid thereon; the load port portion includes: a port door capable of being raised and lowered and having one face on which the lid is laid with an outer face of the lid being in contact with the one face; and a buffer chamber defined by wall surfaces arranged surrounding an outer periphery of the port door in a region where the port door is raised and lowered, and by a bottom face arranged opposed to the other face of the port door; the lid of the clean box has: a cam plate capable of engaging with the latch pin and actuating in accordance with a turning movement of the latch pin; and a latch member protruding to an outside of the lid to engage a latch hole of the main body of the clean box or being confined within the lid to be released from the latch hole of the main body of the clean box in accordance with an actuation of the cam plate; the lid of the clean box further includes a non-circular receiving hole; the opening/closing mechanism further includes a protrusion that can be fittingly inserted into the receiving hole; the clean device includes a first exhaust port arranged close to the port door in the buffer chamber and a second exhaust port arranged apart from the first exhaust port of the buffer chamber; and the method includes: making the latch pin capable of engaging with the cam plate when the clean box is laid on the load port, and fittingly inserting the protrusion of the opening/closing mechanism into the lid of the clean box; evacuating an interface portion where the port door and the lid are joined to each other, from the first exhaust port; evacuating the buffer chamber from the second exhaust port; and lowering the port door and transferring the substrate into the buffer chamber. Owing to this method, in a clean device whose internal environment is kept cleaner than an external environment to receive a substrate from a clean box so as to process the substrate, the cleans device having a lid and a main body, being kept highly clean inside, and having the substrate stored in the inside, the substrate can be taken out easily and reliably by separating the lid from the main body of the clean box.

Further, to solve the above-mentioned problems, the present invention provides a substrate processing device load port on which a clean box including a main body and a lid, which is laid with a substrate and fitted to the main body, is laid, for extracting the substrate from an inside of the cleaning box, including: a port door having an outer face on which the lid is laid; a buffer chamber defined by wall surfaces arranged surrounding an outer periphery of the port door, and by a bottom face arranged opposed to an inner face of the port door; raising/lowering means joined to the inner face of the port door, for raising and lowering the port door along a direction perpendicular to the face of the port door; and a bellows arranged along an outer periphery of the raising/lowering means, the substrate processing device load port being characterized in that: the bellows is coupled at one end thereof to the bottom face of the buffer chamber; and the bellows is fixed at the other end thereof to the raising/lowering means outside the buffer chamber. That is, the port door can be raised and lowered without producing dust.

Further, to solve the above-mentioned problems, the present invention provides an opening/closing mechanism arranged in a substrate processing device to extract a substrate from a clean box and process the substrate by means of the substrate processing device, the cleaning box having: a lid which has a cam plate and a latch member that moves to protrude from the lid or to be confined within the lid by means of the cam plate, and on which the substrate can be laid; and a main body that is coupled to the lid by means of a latch hole for receiving a tip of the latch member when the latch member protrudes from the lid, characterized in that: the opening/closing mechanism includes a rotatable latch pin for engaging the cam plate; the lid further includes a non-circular receiving hole; the opening/closing mechanism includes a protrusion that can be fittingly inserted into the receiving hole; and the opening/closing mechanism and the lid are coupled to each other through engagement between the protrusion and the receiving hole to remove the lid from the clean box. That is, the port door becomes thereby capable of fixing the lid, so the lid can be positively moved away from the main body of the clean box not solely due to the weight of the lid itself.

Further, the present invention has been made in view of the above-described circumstances, and it is an object of the present invention to provide an article accommodating container for accommodating an article such as a pod, for example, an SMIF type pod, in which a lid is prevented from falling off etc. at the time of a vacuum break and the generation of particles resulting from a latch mechanism is suppressed. More specifically, it is an object of the present invention to provide an article accommodating container capable of suppressing the generation of particles resulting from a latch mechanism and also preventing particles or the like from entering the inside of the container when the pressure in the container is lower than an atmospheric pressure (i.e., when the inside of the container is depressurized).

To solve the above-mentioned problems, an article accommodating container according to the present invention relates to an article accommodating container including: a main body having an inner space capable of accommodating an article and an opening provided vertically below the inner space; and a lid for sealing the inner space by closing the opening, characterized in that: the main body and the lid have a depressurized space arranged therebetween; the lid has a falloff preventing member capable of protruding from an outer periphery of the lid; the main body has a depressed portion for accommodating the falloff preventing member without coming into contact with the falloff preventing member when the falloff preventing member protrudes from the outer periphery of the lid; and the falloff preventing member comes into contact with an inner periphery of the depressed portion when a depressurized state of the depressurized space for sealing the inner space by means of the lid is broken with the falloff preventing member protruding from the outer periphery of the lid.

In the aforementioned article accommodating container, it is preferable that the depressurized space be either identical to or different from the internal space. In the aforementioned article accommodating container, it is preferable that the main body and the lid have horizontally opposed first and second planes respectively, and that the falloff preventing member protrude horizontally from the second plane, and that the depressed portion be formed in the first plane. It is preferable that the internal space be circular or rectangular in its horizontal cross-section, and that four corners of the internal space belong to an arc of a circle having a predetermined radius.

BRIEF DESCRIPTION OF THE DRAWINGS

FIG. 9 is a view showing a relationship between a load port portion and an entire clean device according to a conventional art and the present invention.

BEST MODES FOR CARRYING OUT THE INVENTION

Figure 1A:
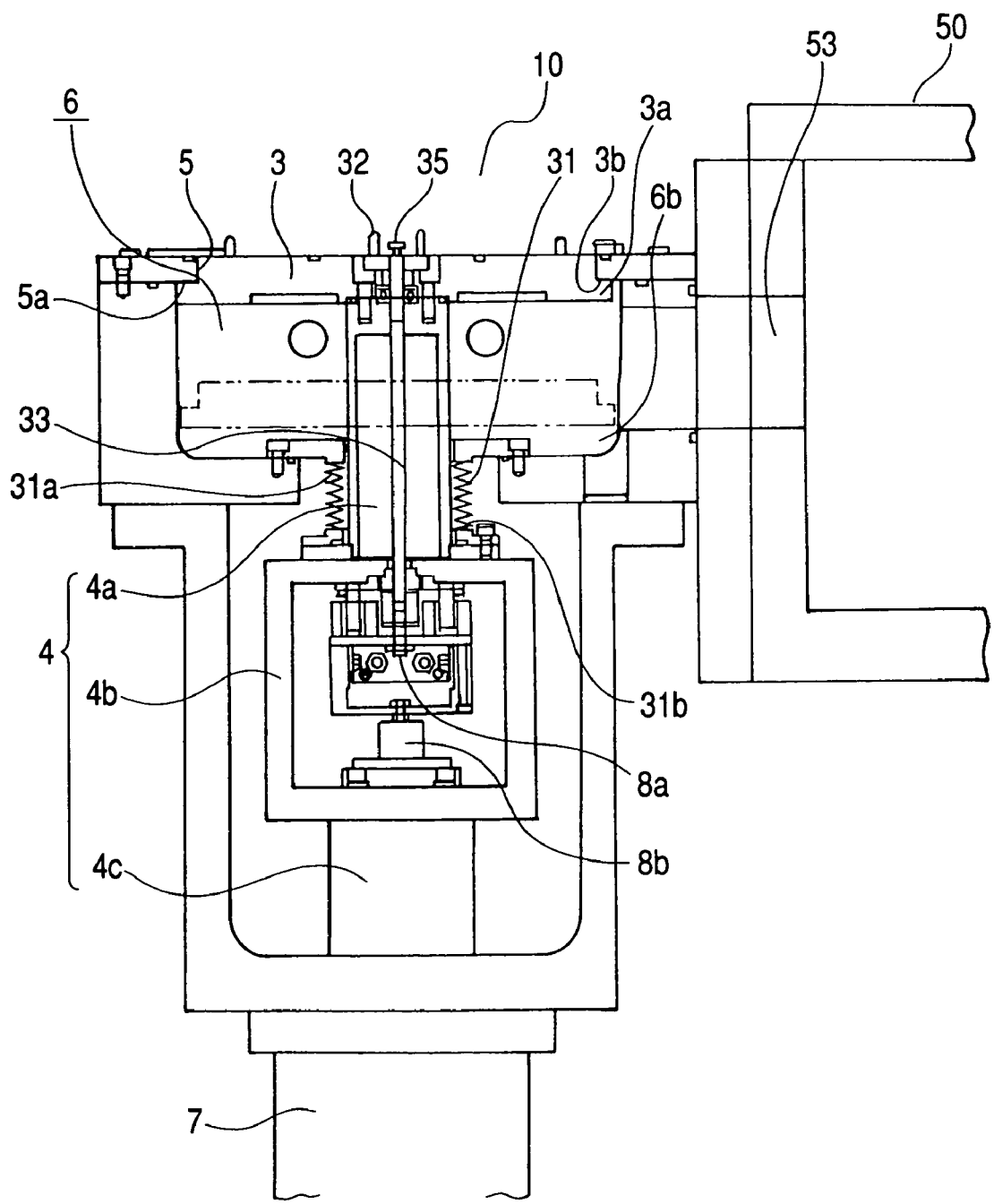
FIG. 1A is a side view of a load port portion of a clean device according to the present invention.

Referring to FIGS. 1A and 1B to FIG. 6, an embodiment of a load port portion 10 of a clean device 1 of the present invention will be described. FIG. 1A is an enlarged view of the load port portion 10 of the present invention. The overall construction of the load port portion 10 in the clean device 1 is the same as the construction described as the conventional art referring to FIG. 9. The clean device 1 and that of FIG. 9 have the following respects in common. The clean device 1 is provided with a processing room 60, a transfer room 50, and the load port portion 10. A clean box 2 is laid on the load port portion 10 so as to transfer a substrate 9 into a semiconductor device. The load port portion 10 has a function of removing a lid 2b from a main body 2a of the clean box 2. In other words, as is the case with the conventional clean device 1, the load port portion 10 is connected to the transfer room 50 via a transfer opening 51, and the load port portion 10 and the transfer room 50 are separated from each other by an opening/closing door 53. A substantially horizontally held port door 3 is arranged within the load port portion 10.

The load port portion 10 has a buffer chamber 6, which is surrounded by wall surfaces surrounding the port door 3 on all four sides and a bottom portion located substantially parallel to a lower face of the port door 3. As is the case with the conventional device, the buffer chamber 6 is classified into two parts for the sake of convenience. That is, one of the parts is an interface space 6a on an upper face side of the port door, the other part is the buffer chamber 6 on a lower face side of the port door 3.

Figure 1B:
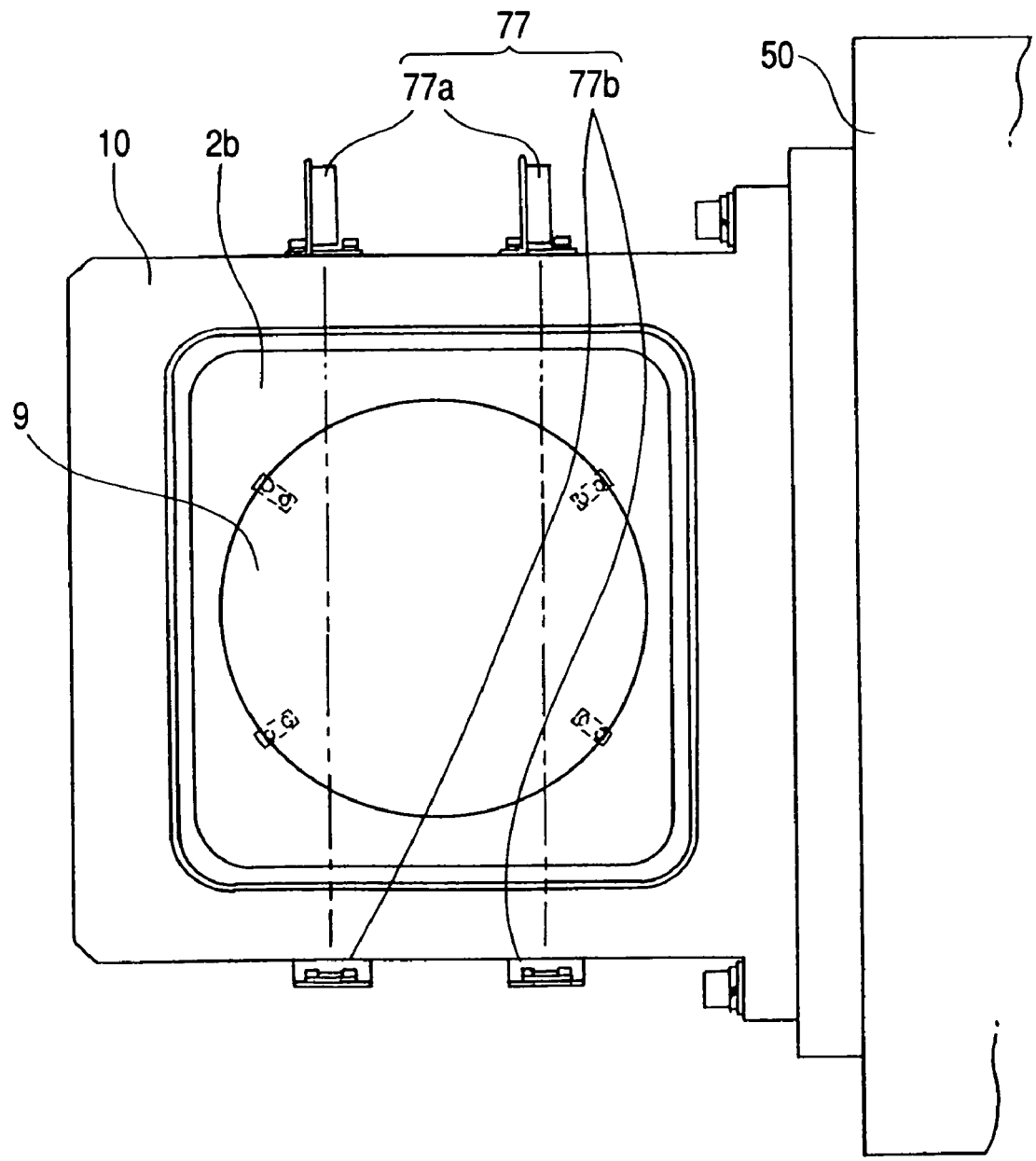
FIG. 1B is a top view of the load port portion of the clean device according to the present invention.

The lower face of the port door 3 is connected to a latch opening/closing shaft 4a arranged below the port door 3. The latch opening/closing shaft 4a is arranged so as to extend outward and downward through a hole arranged through a bottom face of the buffer chamber 6. The latch opening/closing shaft 4a is connected to an electric actuator 7 as raising/lowering means via a frame 4b. The frame 4b is connected to the electric actuator to raise and lower the latch opening/closing shaft 4a vertically. A rotary shaft 33 is arranged within the latch opening/closing shaft 4a in a penetrating manner. Unlike the conventional device, the rotary shaft 33 performs a raising/lowering operation as well as a rotating operation. In order to perform the raising/lowering and rotating operations, a rotary actuator 8a for rotating the rotary shaft 33 and a raising/lowering cylinder 8b for raising/lowering the rotary shaft 33 in the latch opening/closing shaft 4a are arranged within the frame 4b. A substrate detecting sensor 77 is arranged in the load port portion 10 so as to face the wall surfaces surrounding the port door 3 on all four sides. The substrate detecting sensor 77 is composed of emitters 77a for radiating infrared rays from loopholes and detectors 77b for receiving infrared rays emitted from the emitters. The emitters 77a and the detectors 77b are arranged on opposed wall surfaces respectively. FIG. 1B is a vertical top view of the load port portion 10 shown in FIG. 1A, showing a positional relationship between the emitters 77a and the detectors 77b. The substrate detecting sensor 77 is not limited to an infrared sensor. As shown in FIG. 1B, the emitters 77a and the detectors 77b are arranged such that the substrate 9 crosses optical axes of rays emitted from the emitters 77a and reaches the detectors 77b when the substrate 9 is raised and lowered. Therefore, if the optical axes are interrupted at a position where the substrate 9 is supposed to cross them when the port door 3 is raised or lowered, it turns out that the substrate 9 is laid on the lid 2b.

Then, the following description will focus especially on differences between the load port portion 10 of the present invention and the conventional load port portion. The load port portion 10 of the present invention and the conventional clean device 1 mainly share the following two features.

The first feature is that coupling means is provided as an opening/closing mechanism for coupling the port door 3 to the lid 2b of the clean box 2 to open and close the lid 2b. Owing to this feature, the lid 2b can be forcibly removed from the main body 2a of the clean box 2 without counting on the weight of the lid 2b.

The second feature is that, while in the conventional art the bellows 31 is mounted in the buffer chamber 6 between the lower face of the port door 3 and the bottom portion of the buffer chamber 6, in the present invention, the bellows 31, which is coupled at one end 31a thereof to the bottom face portion of the buffer chamber 6 and fixed at the other end 31b thereof to the raising/lowering means 4, is mounted outside the buffer chamber 6. Thus, it is possible to suppress generation of dust in the buffer chamber 6.

In this specification, the term "coupling" means that the lid 2b is coupled so as to move in accordance with a raising/lowering movement of the port door. Those features will be described hereinafter.

(Coupling Means)

Figure 2:
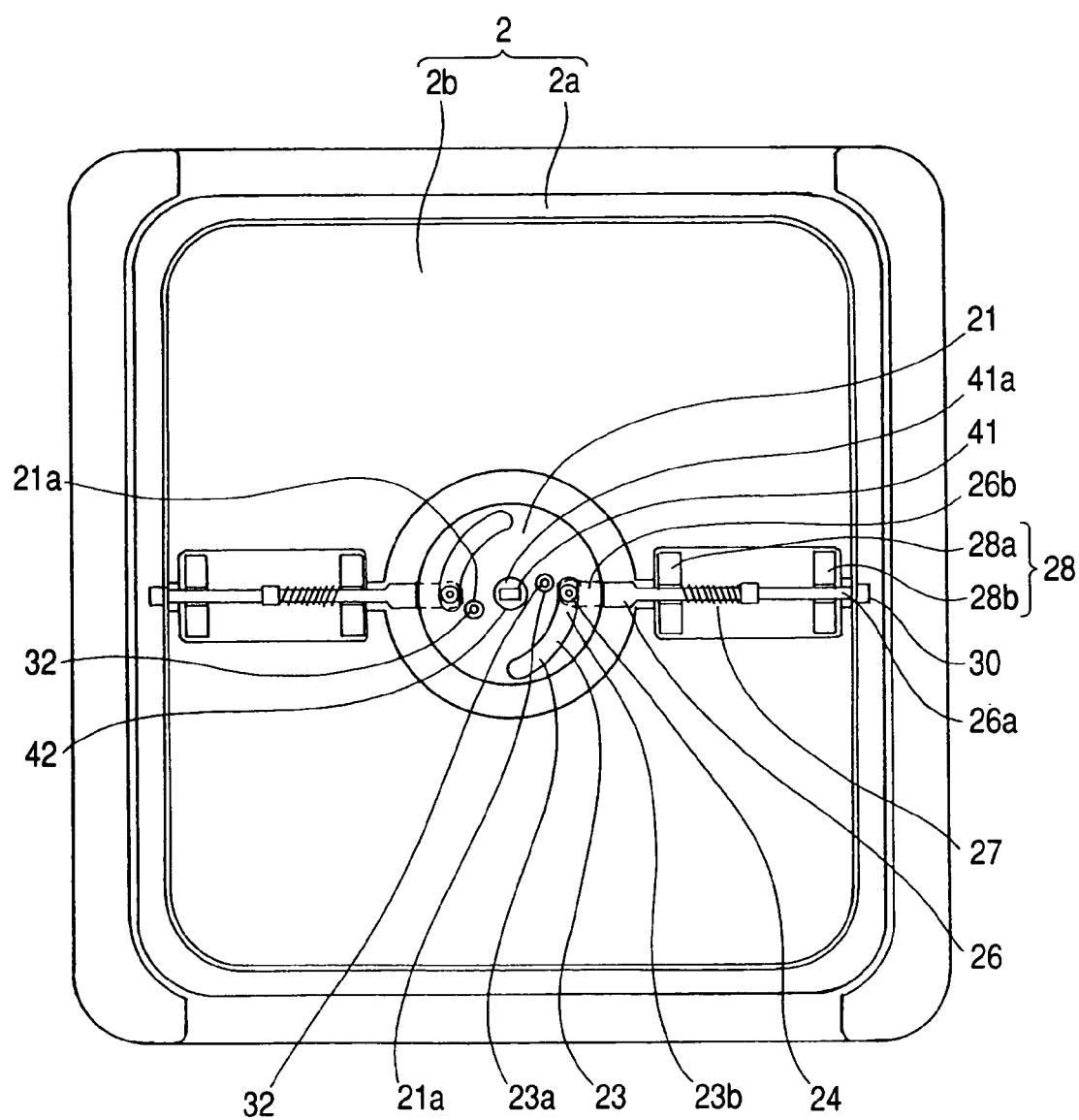
FIG. 2 is a view showing a lid of the clean box according to the present invention.

The port door 3 is provided with the opening/closing mechanism of the present invention. The opening/closing mechanism has coupling means for coupling the lid 2b of the clean box 2 and the port door 3 to each other. Referring first to FIG. 2, the clean box 2, especially the lid 2b of the clean box 2 will be described. FIG. 2 is a top view showing an internal structure of the lid 2b of the clean box 2. As is the case with the conventional rotary cam plate 21, the lid 2b of the clean box 2 is mounted with a latch mechanism. The latch mechanism includes a generally circular rotary cam plate 21 arranged at the center of the lid 2b, and a latch member 26. The rotary cam plate 21 is arranged substantially at the center of the lid 2b of the conventional clean box 2 rotatably around the center. Latch holes 21a arranged on a circle concentric with the rotary cam plate 21 are defined in a central region of the rotary cam plate 21.

Two cam grooves 23, which are point-symmetrical to each other with respect to the center of the rotary cam plate 21, are arranged outside the latch holes 21a of the rotary cam plate 21. Given that each of the cam grooves 23 has one end as a starting point 23a and the other end as an end point 23b, the distance between the starting point 23a of the cam groove 23 and the center of the rotary cam plate 21 is the shortest, whereas the distance between the center of the cam groove 23 on the end point 23b side of the cam groove 23 and the center of the rotary cam plate 21 is the longest. Each of the cam grooves 23 has such a smooth arcuate shape that the distance from the center of the cam plate 21 gradually changes from the starting point 23a to the end point 23b. On the other hand, the lid 2b has the latch member 26 movable parallel to a plane thereof. A driven pin 24 is arranged at an end portion 26b of the latch member 26 on the rotary cam plate 21 side. This driven pin 24 is in engagement with the cam groove 23. The latch member 26 also includes a tip portion 26a protruding from a lateral face of the lid 2a. The latch member 26 is slidably held between a guide member 28a and a guide member 28b in such a manner that the latch member 26 penetrates through guide holes formed therein. The guide holes are substantially identical to the latch member 26 in cross-sectional shape. A spring 27 is fitted between the guide member 28a and the guide member 28b, urging the latch member 26 to expand to the outside of the lid 2b. The setting of the urging direction of the spring 27 can be modified as required either to the direction in which the latch member 26 expands outwardly or to a direction in which the latch member 26 contracts inwardly. When the rotary cam plate 21 rotates, the cam groove 23 also rotates in response thereto, so the latch member 26 is accommodated inside the lid 2b or protrudes outside the lid 2b. A latch hole 30 is arranged through an edge of the main body 2a of the clean box 2 abutting on the lid 2b, at a position corresponding to the tip portion 26a of the latch member 26. When the latch member 26 protrudes with the tip portion 26a protruding outside the lid 2b, the tip portion 26 of the latch member 26 is received in the latch hole 30 and engaged therewith, so the lid 2b is fixed to the clean box 2. On the other hand, when the latch member 26 is drawn furthest inside the lid 2b due to rotation of the rotary cam plate 21, the tip portion 26a of the latch member 26 is accommodated in the lid 2b, so the lid 2b is not coupled to the clean box 2. The diameter of the latch hole 30 is sufficiently larger than that of the latch member 26 received in the latch hole 30, thus preventing dust from being generated through sliding friction between the latch hole 30 and the latch member 26. With this construction as well, since the lid sticks to the clean box 2 in an attractive manner when the clean box 2 is a vacuum, there is no possibility of the lid 2b falling off from the main body 2a of the clean box 2.

The lid 2b and the port door 3 of the present invention are coupled to each other and therefore equipped with coupling means composed of what are called male-side coupling means and female-side coupling means. It is optional which one of the male-side coupling means and the female-side coupling means is arranged on the lid 2b side. This embodiment will be described as a representative example on the premise that the female-side coupling means is arranged on the lid 2b side and the male-side coupling means is arranged on the port door 3 side.

First of all, the female-side coupling means on the lid 2b side will be described. A counter boring 42 and a receiving hole 41 as the female-side coupling means are arranged through a central portion of the lid 2b. The receiving hole 41 is arranged so as to extend through from the face of the lid 2b abutting on the port door 3 to a bottom portion of the counter boring 42. The receiving hole 41 typically assumes a non-circular shape. For instance, the receiving hole 41 may assume a rectangular or elliptical shape. It is appropriate that the counter boring 42 is larger in size than the receiving hole 41, and that a bearing surface of the counter boring 42 remains as a seat 41a of the receiving hole 41.

Figure 3A:
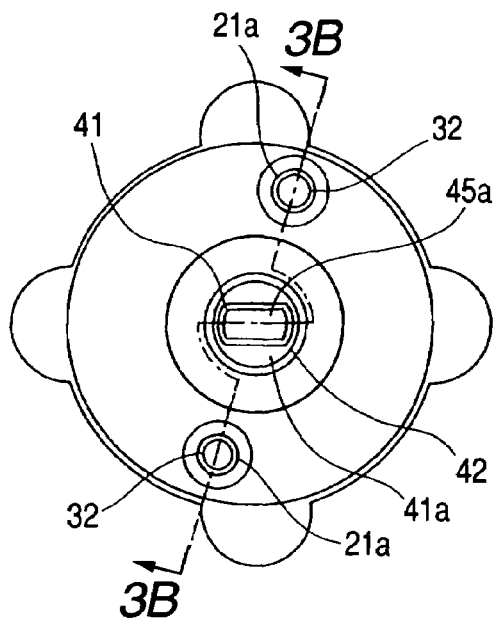
FIG. 3A is a view showing a rotary cam plate of the lid of the clean box according to the present invention.

Then, the coupling means on the port door 3 side will be described with reference to FIGS. 3A, 3B, 4A, and 4B. In this state, namely, the latch opening/closing shaft 4a has been raised and the port door 3 abuts on the lid 2b, as described above as to the conventional art. Each of FIGS. 3A and 4A is an enlarged view showing the rotary cam plate 21 portion when the port door 3 abuts on the lid 2b. On the other hand, FIGS. 3B and 4B are sectional views taken along a line 3B-3B of FIG. 3A and a line 4B-4B of FIG. 4A, respectively.

The male-side coupling means is arranged at a position corresponding to the center of a rotary circular plate 21 at the end portion of the rotary shaft 33 on the lid 2b side. A protrusion 45 as the male-side coupling means is equipped with a cylindrical root portion 45b extending from an end face of the rotary shaft 33, and a brim portion 45a arranged on a tip portion side of the root portion 45b. The brim portion 45a achieves its effect if it is larger in cross-sectional area than the root portion 45b. When a projection plane of the brim portion 45a is viewed along a center axis of the rotary shaft 33 from the lid 2b side toward the plane of the port door 3, the projection plane of the brim portion 45a is substantially similar in shape to and slightly smaller than a through-hole 42 to the extent that the brim portion 45a can be fittingly inserted into the receiving hole 41. When viewed from that direction after having been further rotated, the brim portion 45a deviates in shape from the receiving hole 41, thus creating an overlapping region. This overlapping region enables engagement with the seat 41a of the receiving hole 41 as the bearing surface of the counter boring 42. In this embodiment, the receiving hole 41 is a substantially rectangular long hole, and the brim portion 45a has a substantially rectangular shape allowing insertion into the receiving hole 41 and is slightly smaller than it.

The rotary shaft 33 arranged inside the latch opening/closing shaft 4a can be raised and lowered in such a manner that the rotary shaft 33 slides along a central axis of a raising/lowering shaft 3 within the latch opening/closing shaft 4a. On the other hand, the latch pins 32 are arranged at the tip of the latch opening/closing shaft 4a so as to protrude vertically from the port door 3. The latch pins 32 are located at positions corresponding to the latch holes 21a of the rotary cam plate 21 on a circumference of a circle substantially concentric with the rotary cam plate 21, and arranged point-symmetrically to each other with respect to the center of the rotary cam plate 21.

Figure 3B:
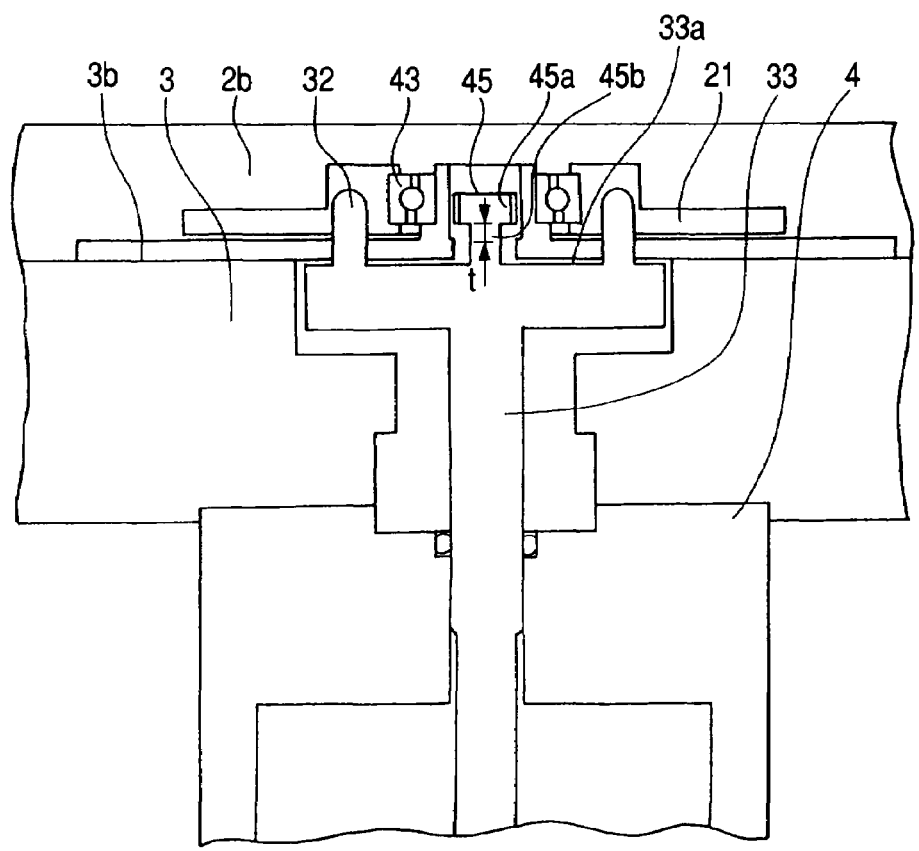
FIG. 3B is a sectional view showing in detail a positional relationship between the rotary cam plate of the lid of the clean box according to the present invention and a port door of the load port portion, taken along the line 3B-3B in FIG. 3A.
Figure 4A:
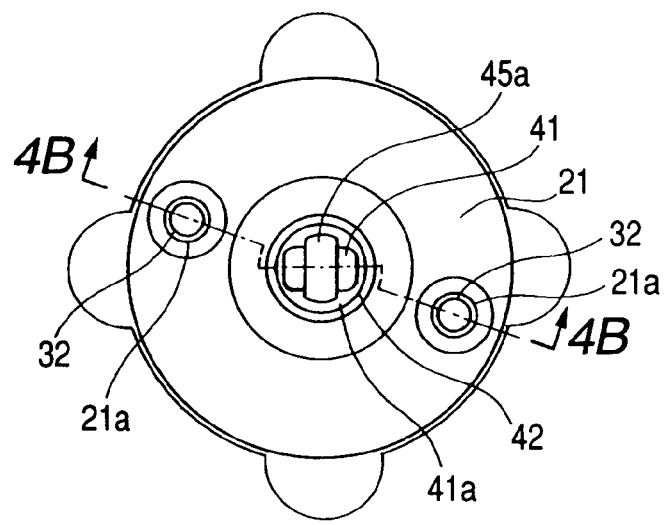
FIG. 4A is a view showing the rotary cam plate of the lid of the clean box according to the present invention.
Figure 4B:
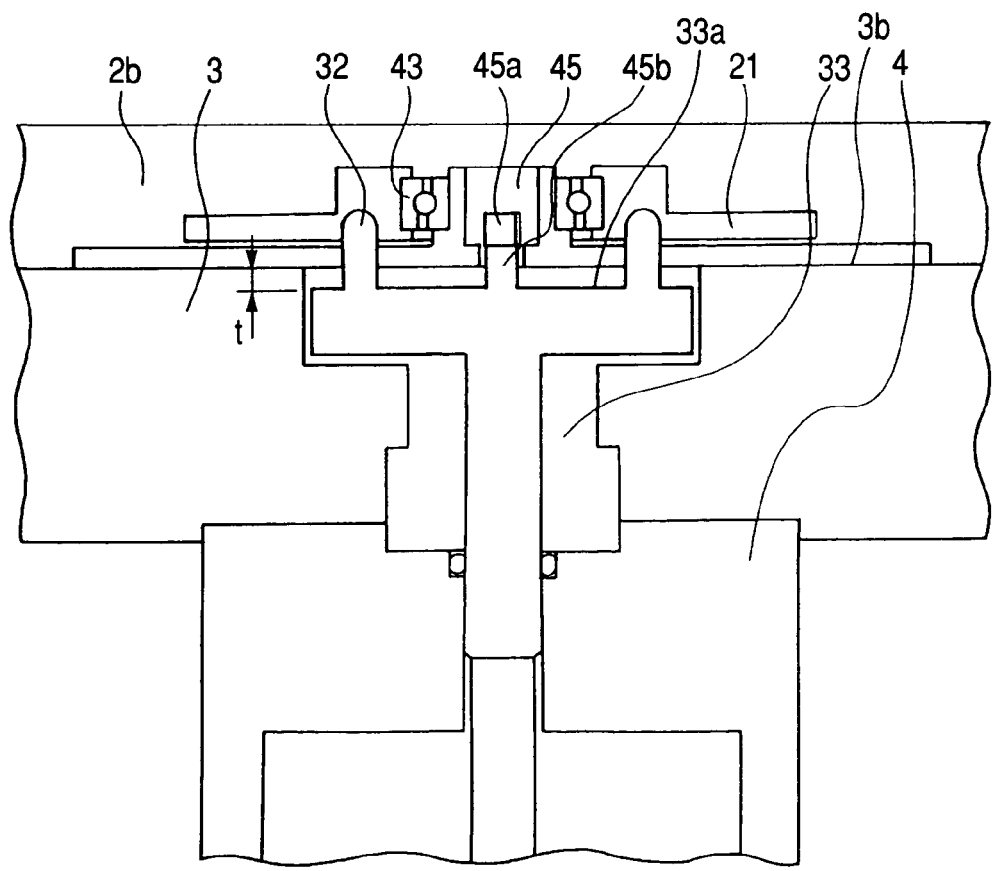
FIG. 4B is a sectional view showing in detail a positional relationship between the rotary cam plate of the lid of the clean box according to the present invention and the port door of the load port portion, taken along the line 4B-4B in FIG. 4A.

In this case, when the rotary shaft 33 is raised within the latch opening/closing shaft 4a as shown in, for example, FIG. 3B, the brim portion 45a is fittingly inserted into the receiving hole 41, and the latch pins 32 are fittingly inserted into the latch holes 21a. At this stage, the shapes of the brim portion 45a and the receiving hole 41 projected onto the plane of the rotary cam plate 21 are substantially identical to each other. When the rotary shaft 33 is rotated at this stage, the projections of the brim portion 45a and the receiving hole 41 onto the plane of the rotary cam plate 21 are different in shape from each other as shown in FIG. 4A and create overlapping regions, respectively. Those overlapping regions correspond to the seat 41a of the receiving hole 41. The port door 3 and the lid 2b can be coupled to each other through mutual contact of the overlapping regions.

The fragile substrate 9 is laid on the lid 2b and thus may be damaged when strong vibrations are transmitted to the lid 2b. Thus, the brim portion 45a and the seat 41a of the receiving hole 41 do not engage each other when the rotary shaft 33 is rotated. The projections of the brim portion 45a and the receiving hole 41 onto the rotary cam plate 21 are different in shape from each other and create overlapping regions when the rotary shaft 33 is rotated. The influence on the substrate 9 can be reduced by thereafter lowering the rotary shaft 33 to bring the overlapping regions into contact with each other. More specifically, the height between the face of the seat 41a of the receiving hole 41 as the bearing surface of the counter boring 42 and the face of the brim portion 45a contactable with the seat 41a (the lower face in this embodiment) is set to a predetermined height (t) as a backlash. As soon as this predetermined height (t) is ensured, the rotary shaft 33 is operated to be rotated and then moved downward. Then, as soon as the rotary shaft 33 is lowered by the predetermined height (t), the seat 41a of the receiving hole 41 as the bearing surface of the counter boring 42 and the face of the brim portion 45a contactable with the seat 41a engage each other, thus completing the process of coupling.

If the rotary shaft 33 is set to become as high as the face of the lid 2b when being raised to the highest position, the end face 33a of the rotary shaft 33 and the face 3b of the port door 3 are substantially equal in height to each other, thus allowing abutment on the face of the lid 2b. The latch pins 32 are fitted into the latch holes 21a and turned by rotating the rotary shaft 33. The latch member 26 thereby moves with respect to the lid 2b, thus making it possible to open the lid 2b from the main body 2a of the clean box 2 and fix the lid 2b to the port door 3 at the same time.

By combining the aforementioned coupling means with the clean box 2 described with regard to the conventional art, it becomes possible to realize an efficient step of simultaneously performing the operation of fixing/releasing the lid 2b to/from the port door 3 and the operation of coupling the lid 2b to the port door 3. This step will be described with reference to FIGS. 2, 3A, 3B, 4A, and 4B.

In this case, a representative example in which the lid 2b fixed to the main body 2a of the clean box 2 is released from the main body 2a will be described. In fixing the lid 2b fixed to the main body 2a of the clean box 2 to the main body 2a, the following steps should be carried out in reverse order. At first, the port door 3 is located at the highest position. The end face of the latch opening/closing shaft 4a and the end face of the port door 3 are located at the same position. In this state, the clean box 2 is laid on the load port portion 10. At this moment, the clean box 2 is laid such that the protrusion 45 is fittingly inserted into the lid 2b and that the latch pins 32 are fittingly inserted into the latch holes 21a. At this moment, the protrusion 45 and the latch pins 32 are fittingly inserted into the receiving hole 41 and the latch holes 21a, respectively. In this state, the latch member 26 protrudes from the lid 2b and is received in the latch hole 30 arranged through the lateral face of the clean box 2, so the lid 2b is fixed to the clean box 2. When the rotary shaft 33 is rotated at this stage, the latch pins 32 press the edges of the latch holes 21a to rotate the rotary cam plate 21. The driven pin 24 moves along the cam groove 23 as the rotary cam plate 21 rotates. In accordance with this movement of the driven pin 24, the latch member 26a moves so as to be accommodated in the lid 2b and is released from the latch hole 30 of the clean box 2. The brim portion 45a of the protrusion 45 also rotates as the rotary cam plate 21 rotates by being pressed by the latch pins 32. The brim portion 45a and the receiving hole 41 are positioned so as to create overlapping regions when viewed from the lid 2b side in the direction of the plane of the port door 3 along the central axis of the rotary shaft 33, such that the brim portion 45a can be engaged with the seat 41a of the receiving hole 41. As a result, a preparation for coupling is completed (which is referred to as an unlock preparation completion state). Then, when the rotary shaft 33 is lowered by the height t as the backlash, the overlapping regions of the projections of the brim portion 45a and the receiving hole 41 abut on each other and engage each other to couple the lid 2b to the port door 3, so the clean box 3 is also fixed to the lid 2b (which is referred to as a hold-down preparation completion state).

(Arrangement of Bellows)

Figure 5A:
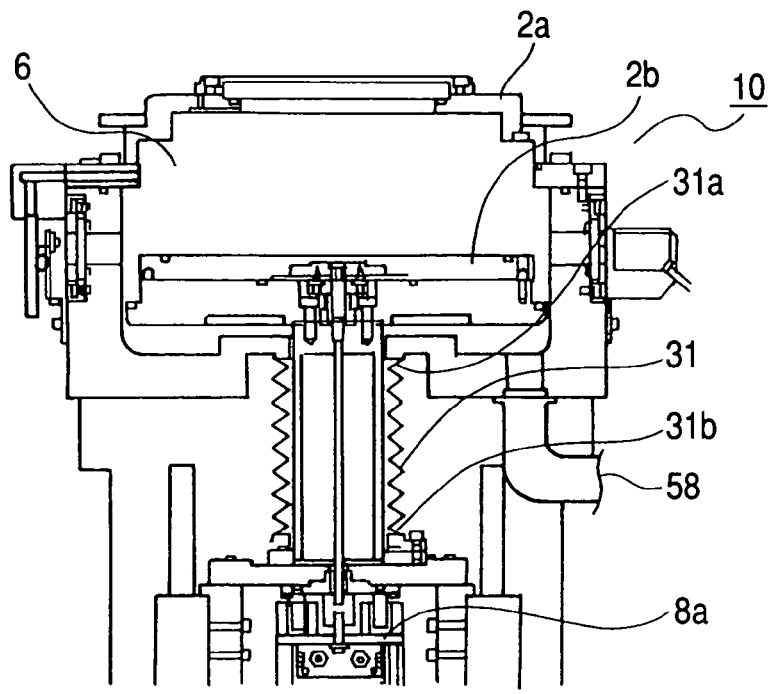
FIG. 5A is a view showing the load port portion according to the present invention with the port door in its lowered state.
Figure 5B:
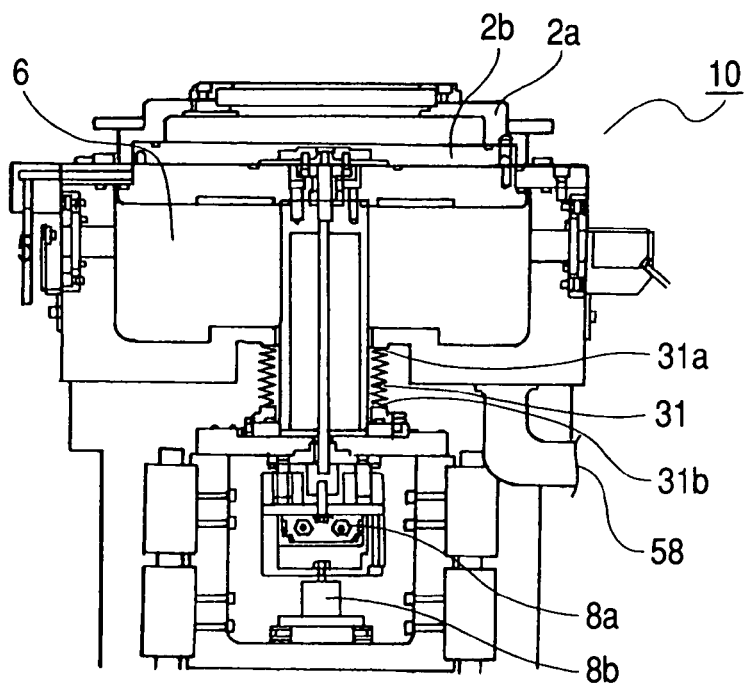
FIG. 5B is a view showing the load port portion according to the present invention with the port door in its raised state.

Then, the bellows 31 of the present invention will be described with reference to FIGS. 1A, 5A, and 5B.

The bellows 31 is tightly coupled at one end 31a thereof to the bottom face outside the buffer chamber 6, and is fixed at the other end 31b thereof to the frame 4b and the latch opening/closing shaft 4a for performing raising/lowering operations by means of the electric actuator outside the buffer chamber 6. Thus, the bellows 31 is always arranged outside the buffer chamber 6. If this arrangement is adopted, the bellows 31 always performs its expansion/contraction movements outside the buffer chamber 6 both when the port door 3 is lowered as shown in FIG. 5A and when the port door 3 is raised as shown in FIG. 5B. By adopting this arrangement, the clearance between the bellows 31 and the latch opening/closing shaft 4a located inside the bellows 31 as well as the buffer chamber 6 can maintain vacuum even when the buffer chamber 6 is evacuated through an exhaust port 58. Although conventionally the bellows 31 generates dust in the buffer chamber 6, adoption of the arrangement of the present invention produces effects unachievable by the conventional device. That is, (i) the amount of dust can be limited to that of dust flowing into the buffer chamber 6 from a clearance 31c between the inside of the bellows 31 and the buffer chamber 6, and (ii) the bellows 31 usually falls downward due to the gravity and can be prevented from rising.

Then, the operation of the load port portion 10 of the clean device 1 of the present invention will be described with reference to FIGS. 6, 7, and 8A to 8D.

Figure 6:
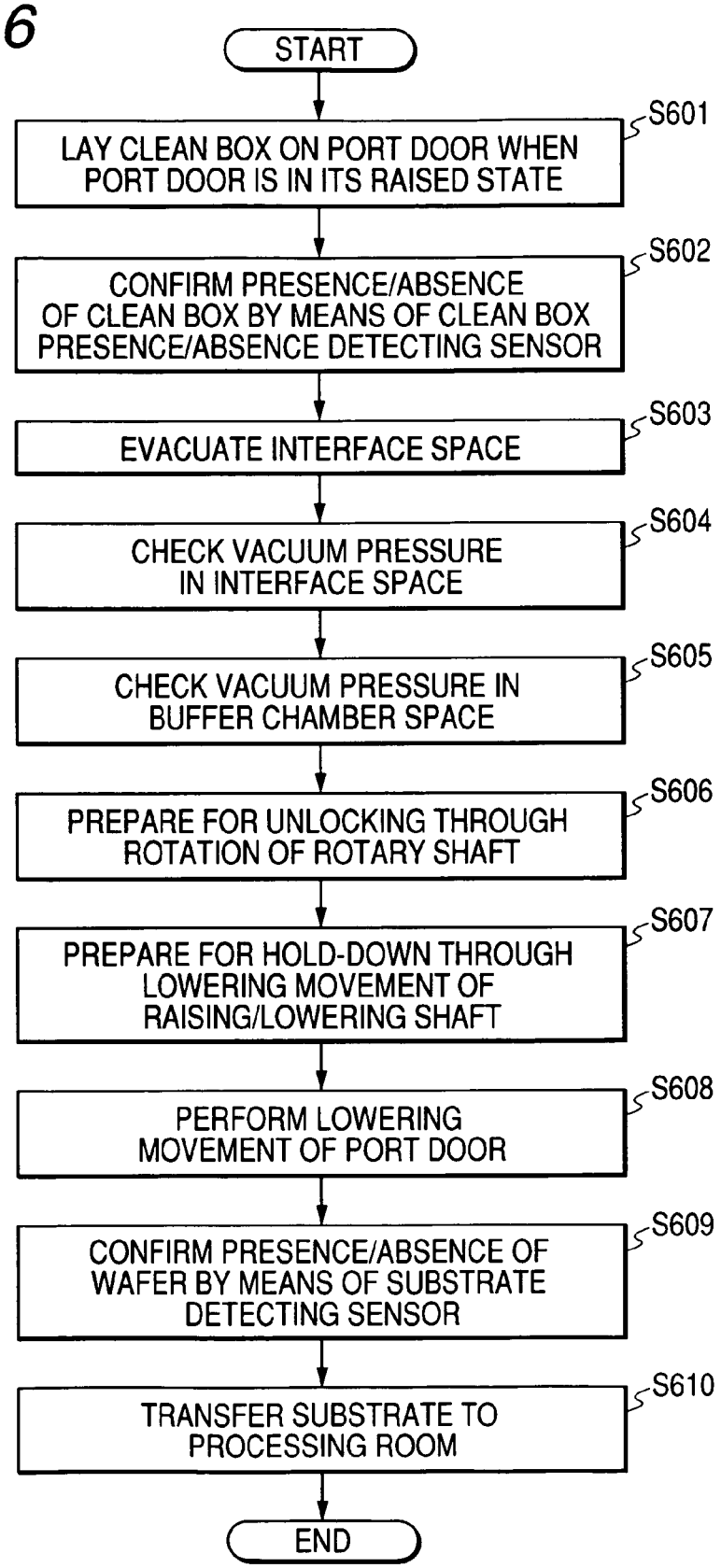
FIG. 6 is a flowchart showing a loading operation in the load port portion according to the present invention.

First of all, a loading operation will be described with reference to FIG. 6.

Figure 8A:
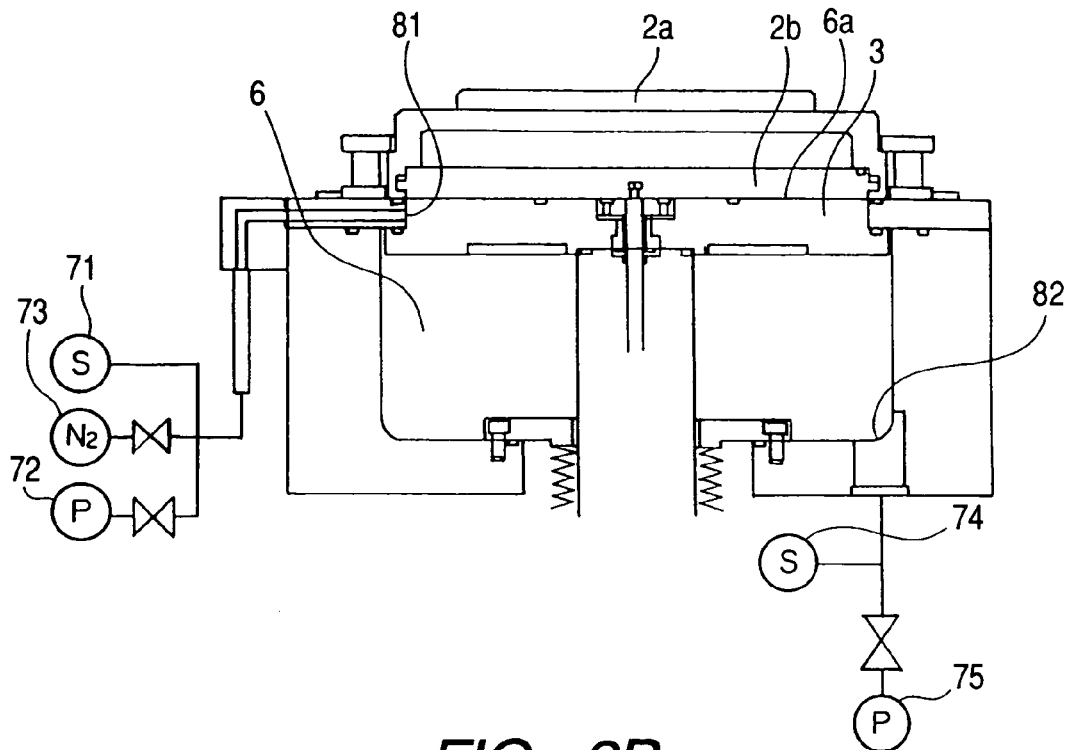
FIG. 8A is a view showing a positional relationship of the port door in the flow of the loading operation and the unloading operation performed in the load port portion according to the present invention.
Figure 8B:
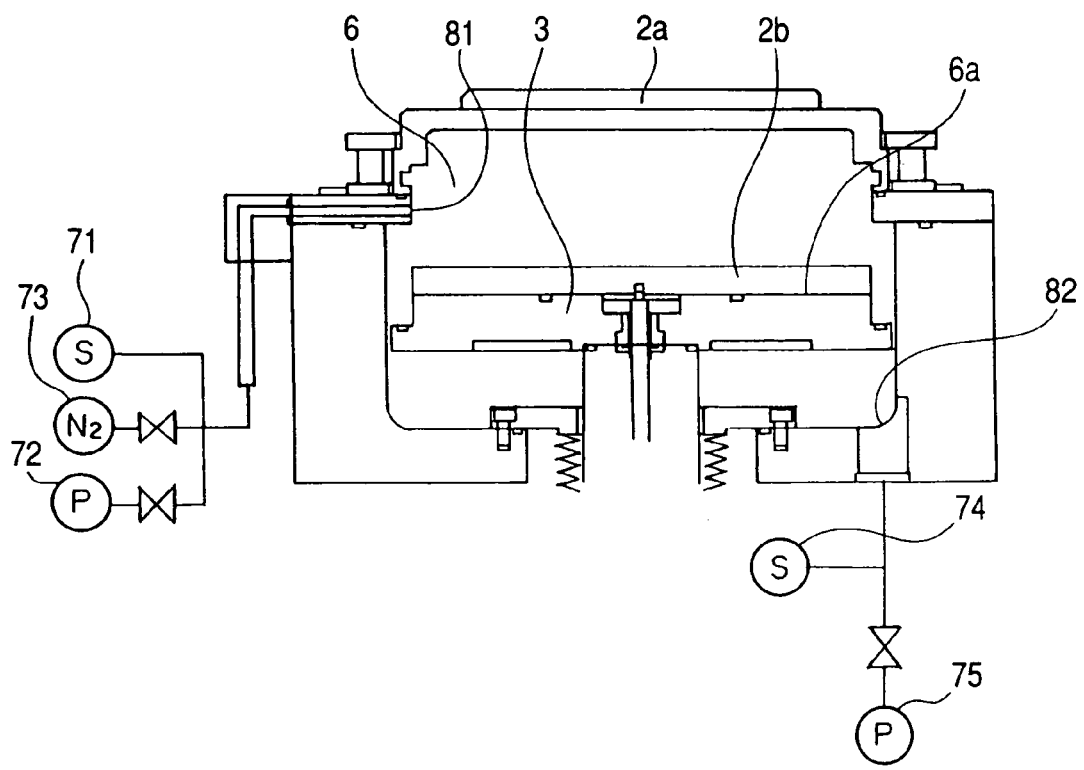
FIG. 8B is a view showing a positional relationship of the port door in the flow of the loading operation and the unloading operation performed in the load port portion according to the present invention.
Figure 8C:
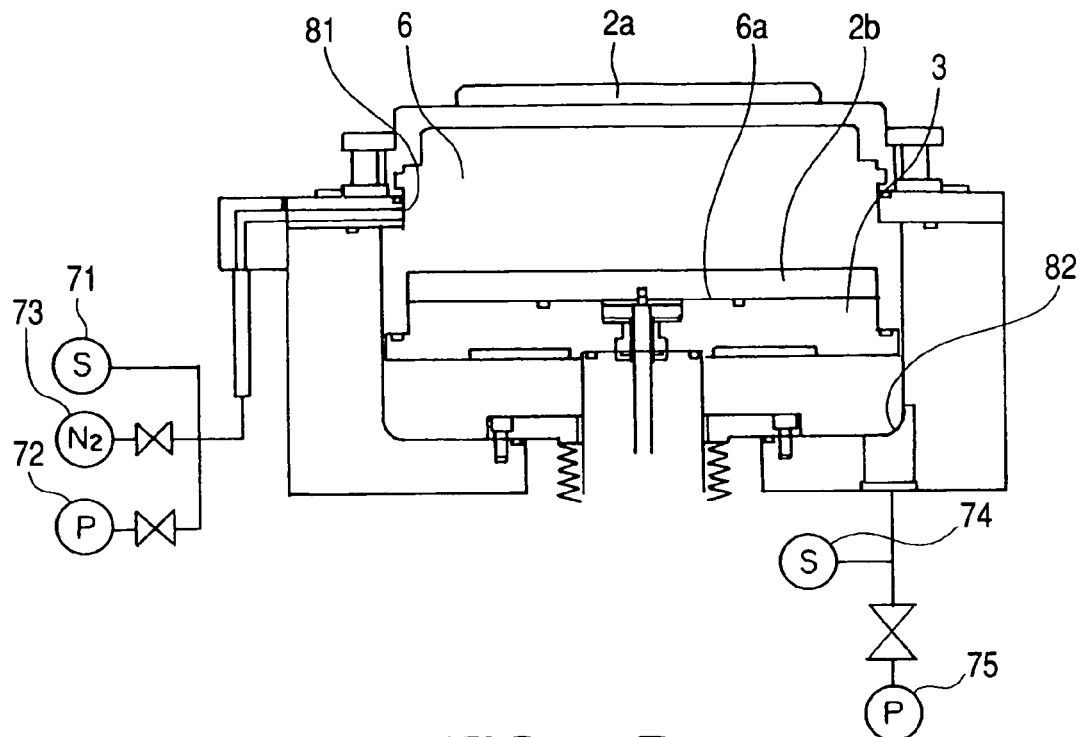
FIG. 8C is a view showing a positional relationship of the port door in the flow of the loading operation and the unloading operation performed in the load port portion according to the present invention.
Figure 8D:
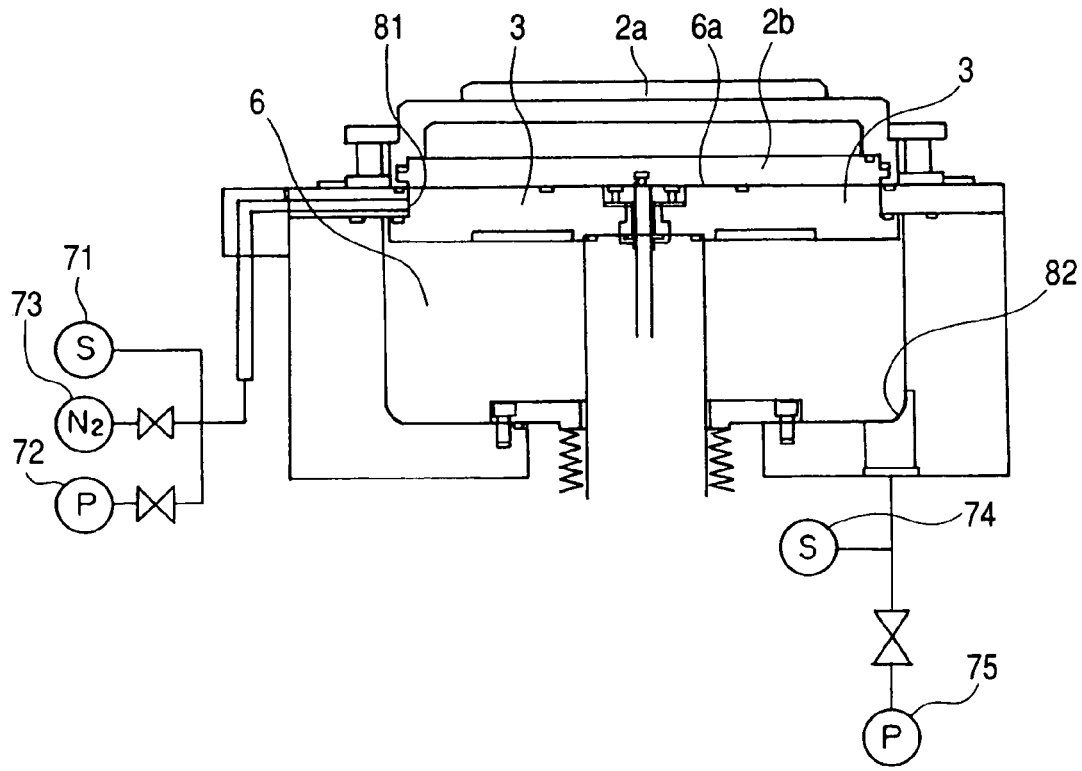
FIG. 8D is a view showing a positional relationship of the port door in the flow of the loading operation and the unloading operation performed in the load port portion according to the present invention.

At first, the port door 3 is located in the load port portion 10 with its load port having been raised to the highest position (a state shown in FIG. 8A). At this stage, a robot (not shown) or a transfer vehicle (not shown) arranged outside the clean device 1 lays the clean box 2 on the port door 3 of the load port portion 10 of the clean device 1. In this process, the latch pins 23 and the protrusion 45 are fitted into the latch holes 21a and the receiving hole 41, respectively (S601). Then, the presence or absence of the clean box 2 is confirmed by means of a clean box presence/absence detecting sensor on the port door 3 (S602). Then, the interface space 6a is evacuated by carrying out suction and discharge using a first vacuum pump 72 connected to a first exhaust port 81 arranged in the vicinity of the port door 3 that is in its waiting state in the buffer chamber (S603). The interface space 6a is theoretically an interface between the port door 3 and the lid 2b and practically a narrow clearance created between the port door 3 and the lid 2b when the port door 3 is in its raised state. Then, a vacuum pressure of the interface space 6a is detected by an interface pressure sensor 71 arranged in the vicinity of the interface space 6a, and it is confirmed whether or not the detected vacuum pressure has reached a predetermined pressure. When the vacuum pressure has not reached the predetermined pressure, further evacuation is carried out from the first exhaust port 81 using the first vacuum pump 72 (S604). By making the interface space 6a itself a vacuum, the port door 3 and the lid 2b stick to each other. Subsequently, a vacuum pressure in the buffer chamber 6 is detected by a buffer chamber pressure sensor 74, and it is confirmed whether or not the detected vacuum pressure has reached a predetermined pressure. When the detected vacuum pressure has not reached the predetermined pressure, the buffer chamber 6 is evacuated by performing suction and discharge from a second exhaust port 82 arranged apart from the first exhaust port 81 at a position most effective for discharge of the volume of the buffer chamber 6, namely, at a position close to the center or bottom portion of the buffer chamber 6, using a second vacuum pump 75 connected to the second exhaust port 82 (S605). The rotary shaft 33 is rotated by driving the rotary actuator 8a. Thus, the unlock preparation completion state is achieved as described above (S606). The steps described hitherto create the state shown in FIG. 8A.

Then, when the rotary shaft 33 is lowered by the raising/lowering cylinder 8b, the hold-down preparation state is achieved as described above (S607). The port door 3 is lowered by drive means, so the lid 2b is separated from the main body 2a of the clean box 2, lowered to a predetermined position, and then stopped (S608). The substrate detecting sensor 77 in the buffer chamber 6 detects the presence/absence of the substrate 9 on the lid 2b (S609). The robot arm 55 in the transfer room 50 transfers the substrate 9 to the processing room 60 (S610). The steps described hitherto create a state shown in FIG. 8B.

Figure 7:
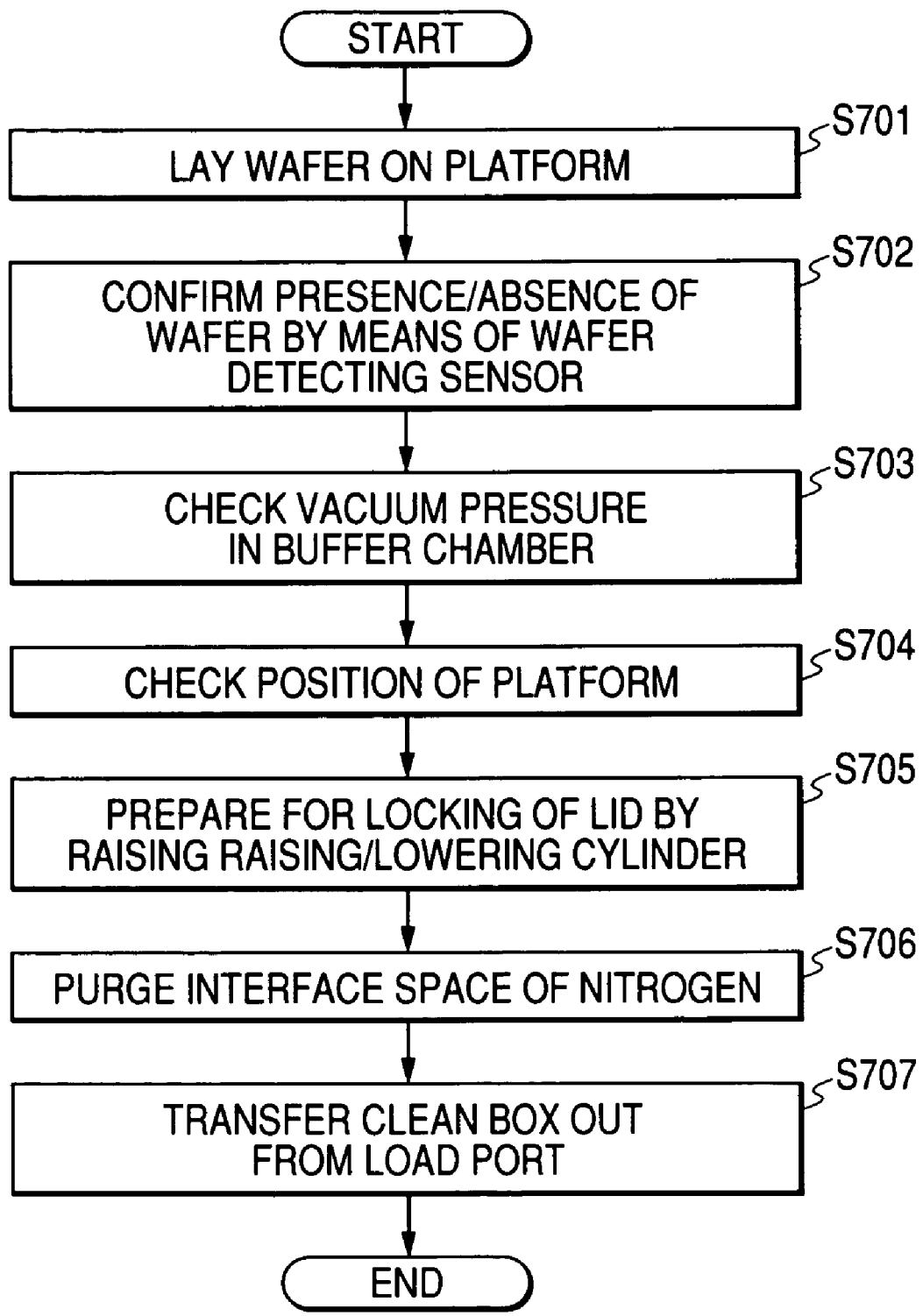
FIG. 7 is a flow chart showing an unloading operation in the load port portion according to the present invention.

First of all, an unloading operation will be described with reference to FIG. 7. Basically, the loading operation is performed in reverse order.

The robot arm 55 in the transfer room 50 fetches the processed substrate 9 from the processing room 60 and lays it at a predetermined position of the lid 2b on the port door 3 waiting in the buffer chamber 6 of the load port portion 10 (S701). The substrate detecting sensor 77 confirms whether or not the substrate 9 is appropriately laid on the port door (S702). A vacuum pressure in the buffer chamber 6 is detected by the buffer chamber pressure sensor 74, and it is confirmed whether or not the detected vacuum pressure has reached a predetermined pressure. When the detected vacuum pressure has not reached the predetermined pressure, further evacuation is carried out from the second exhaust port 82 using the second vacuum pump 75 (S703). It is confirmed whether or not the rotary actuator 8a is in the unlock preparation completion state and whether or not the raising/lowering cylinder 8b is in the hold-down preparation state (S704). The electric actuator 7 raises the port door 3 and closes the buffer chamber 6. In this state, the lid 2b closes the main body 2a of the clean box 2. Then, when the rotary shaft 33 is raised by the raising/lowering cylinder 8b, the shape of the brim portion 45a and the receiving holes 41 are disengaged from each other. When the rotary actuator 8a is driven at this stage to rotate the rotary shaft 33, the latch member 26 of the lid 2b is inserted into the latch hole 30 through rotation of the rotary cam plate 21. The brim portion 45a becomes drawable from the receiving hole 41 (S705). Subsequently, the vacuum interface space 6a is charged with high-purity nitrogen gas from an $N_2$ bomb 73 and purged of the nitrogen gas to be held again at the atmospheric pressure. This is confirmed using the interface space pressure sensor 71 (S706). This step is intended to prevent the port door 3 and the lid 2b from remaining stuck to each other as in the case where the interface space 6a is a vacuum. The robot (not shown) or the transfer vehicle (not shown) transfers the clean box 2 out from the load port portion 10 of the clean device 1 (S707).

Figure 12:
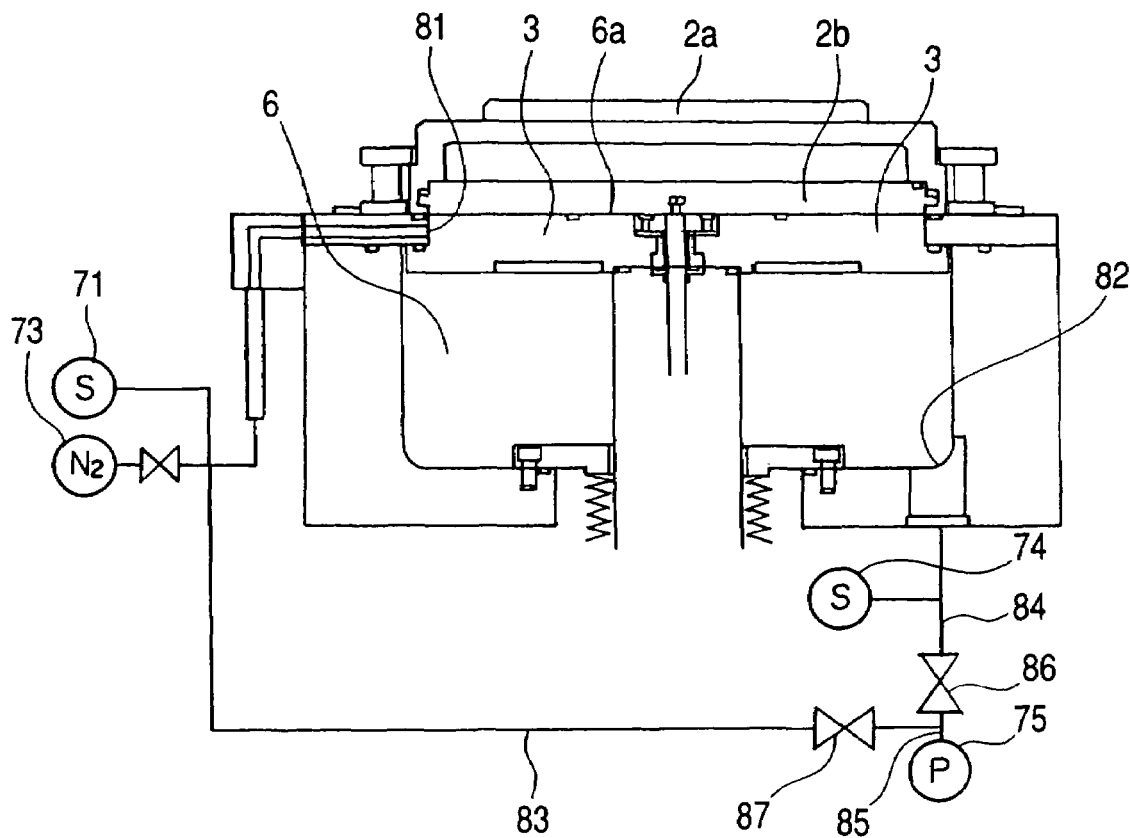
FIG. 12 is a view showing an example of a clean device in the case where a common vacuum pump is employed.

Although the foregoing embodiment has been described on the premise that the first vacuum pump 72 and the second vacuum pump 75 are separate from each other, the first vacuum pump 72 and the second vacuum pump 75 can be integrated into a single common vacuum pump. In this case, the second vacuum pump 75 is employed as the common vacuum pump instead of the first vacuum pump 72 as shown in, for example, FIG. 12. In this embodiment, the second vacuum pump 75 which is the common vacuum pump is connected to a flow channel 85. The flow channel 85 is connected to a first flow channel 83 leading to the first exhaust port 81 and a second flow channel 84 leading to the second exhaust port 82. The first flow channel 83 is provided with a valve 87 for discharging gas from flow channels on the first exhaust port 81 side by means of the vacuum pump. When the valve 87 is opened, it is possible to suck/discharge gas into/from the flow channels of a system on the first exhaust port 81 side including the first flow channel 83, and thus suck/discharge gas into/from the interface space 6a. On the other hand, the second flow channel 84 is provided with a valve 86 for discharging gas from flow channels on the second exhaust port 82 side by means of the vacuum pump. When the valve 86 is opened, it is possible to suck/discharge gas into/from the flow channels of a system on the second exhaust port 82 side including the second flow channel 84, and thus suck/discharge gas into/from the buffer chamber 6. Thus, the same effect as in the foregoing embodiment in which the first vacuum pump 72 and the second vacuum pump 75 are separate from each other is achieved even when the single common vacuum pump is employed.

The present invention achieves the following effect.

By coupling the port door of the load port portion to the lid of the clean box and mounting the bellows outside the buffer chamber, the lid and the main body of the clean box can be coupled/decoupled to/from each other while the clean device is kept highly clean.

Figure 10:
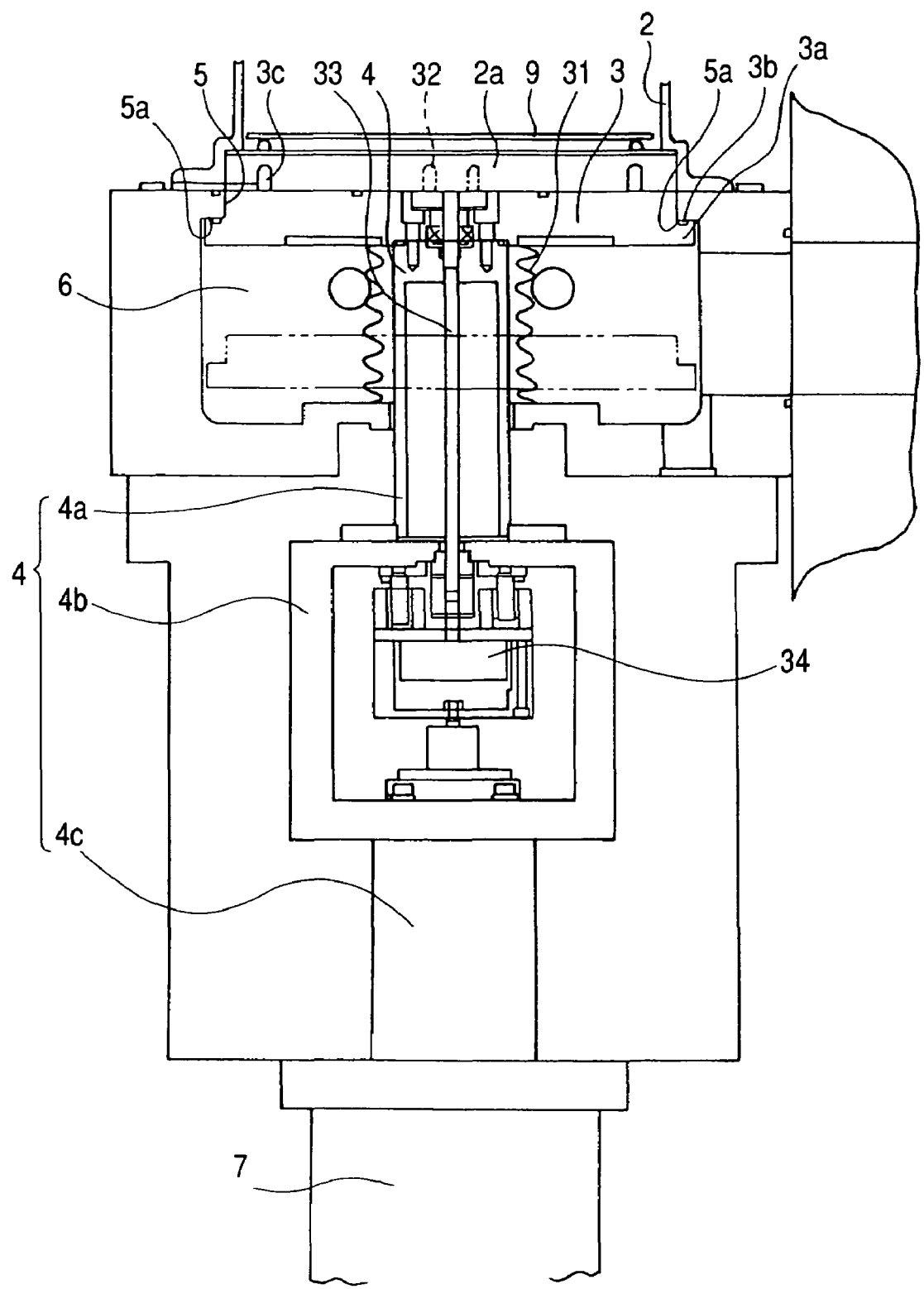
FIG. 10 is a view showing a load port portion of the conventional art.
Figure 11:
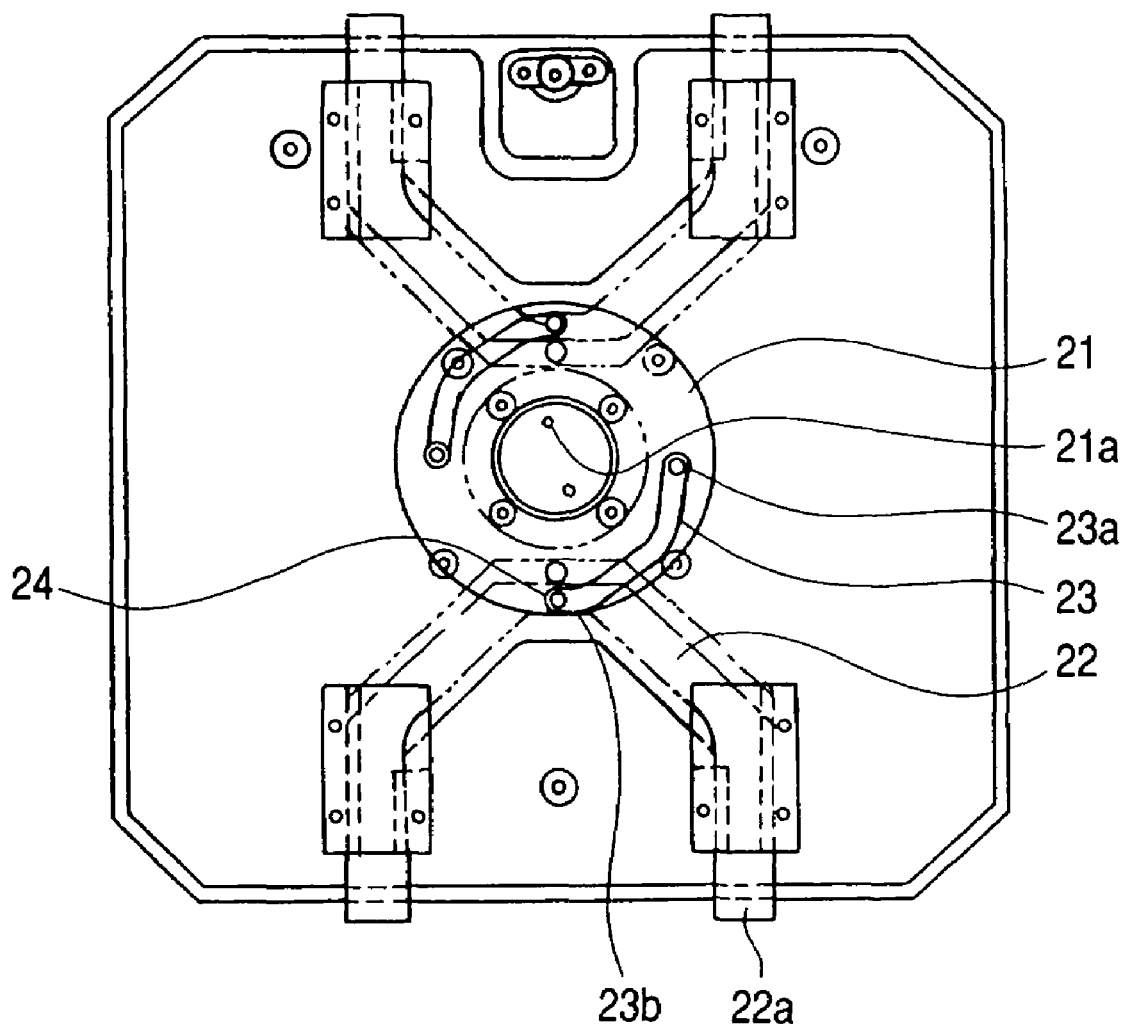
FIG. 11 is a view showing an example of a clean box of the conventional art.
Figure 13:
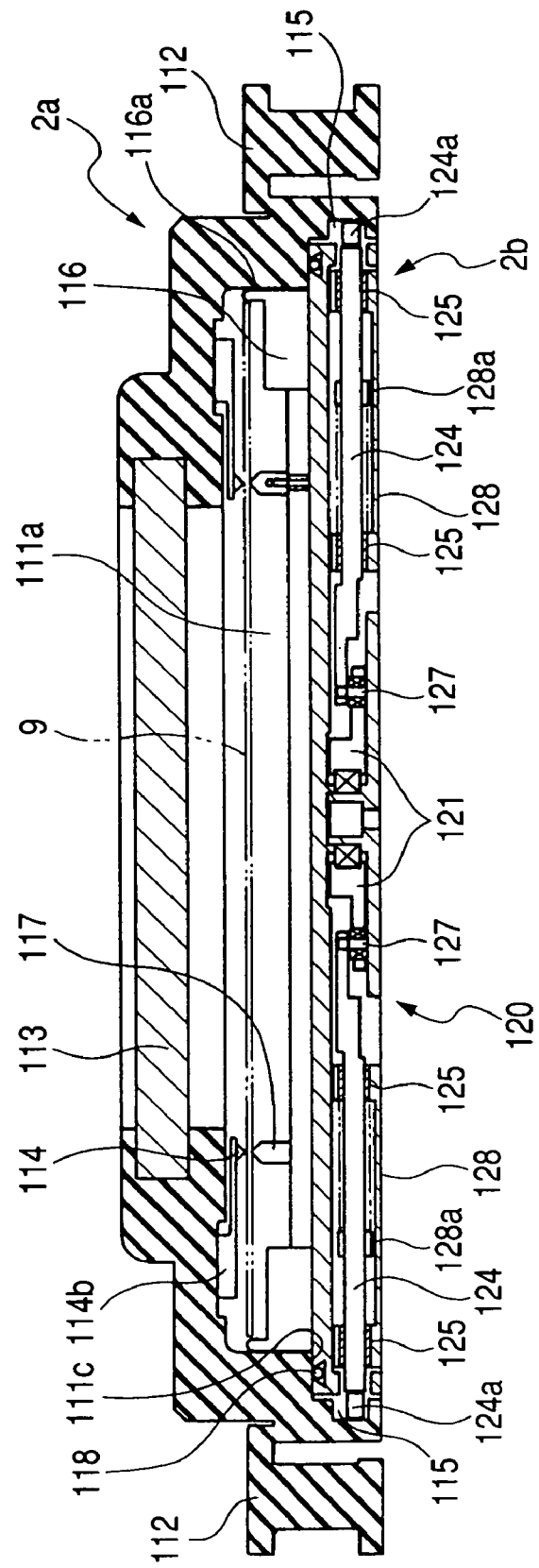
FIG. 13 is a schematic sectional view showing a pod according to another embodiment of the present invention.
Figure 14:
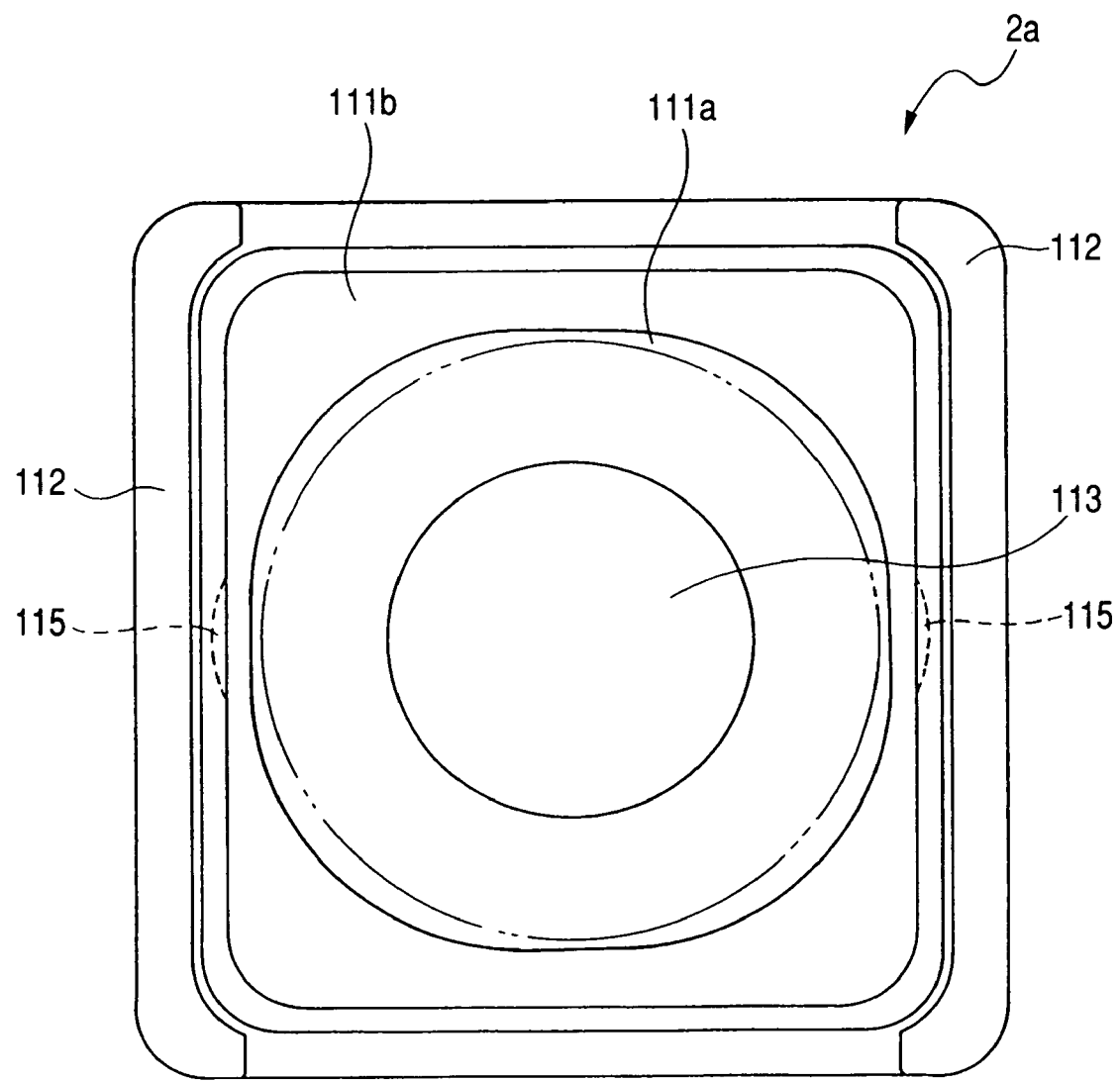
FIG. 14 is a bottom view of a main body of the pod shown in FIG. 13.
Figure 15:
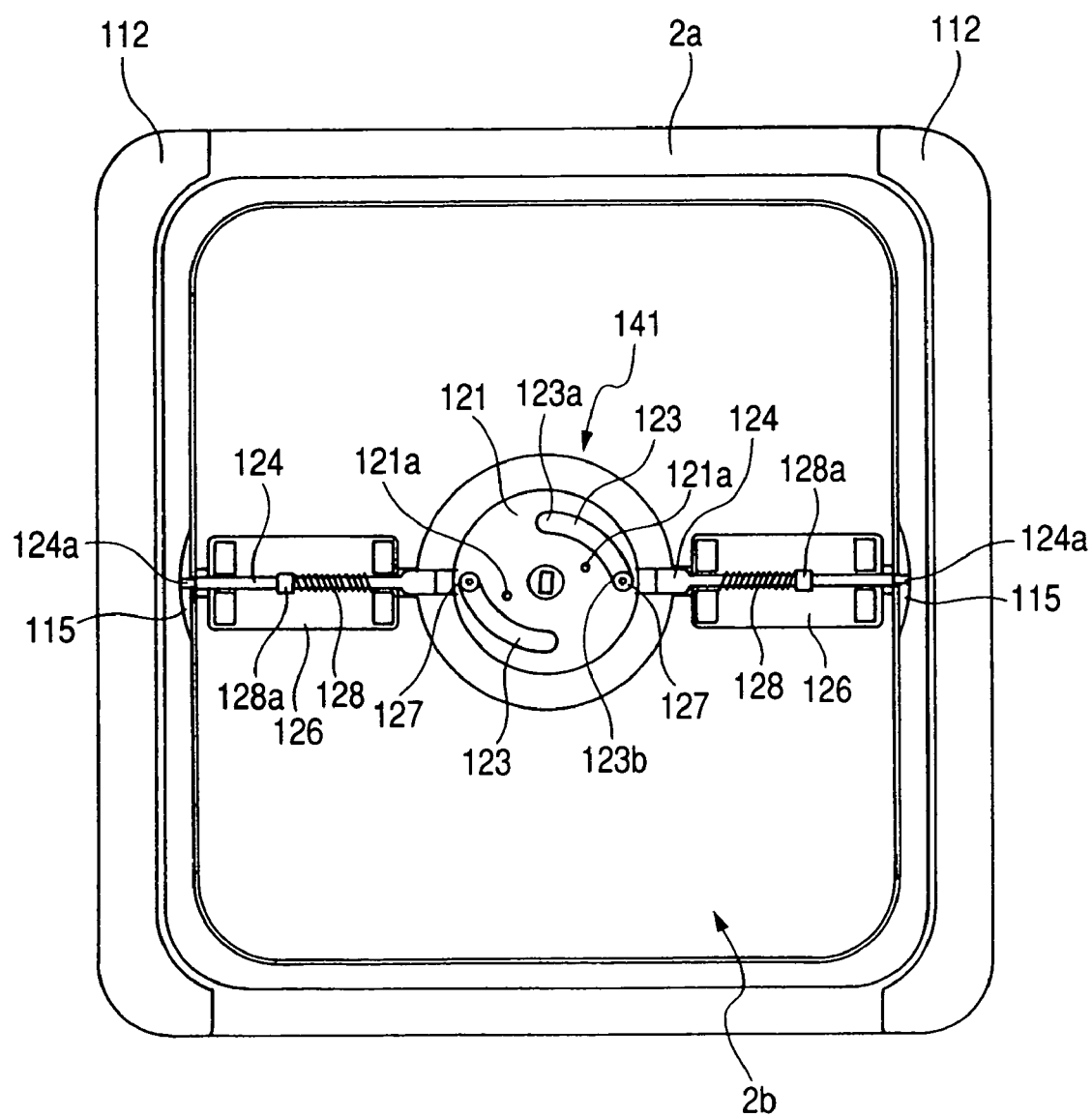
FIG. 15 is a bottom view showing the main body of the pod of FIG. 13 with a lid fitted thereto, and further showing a part relating to a falloff preventing mechanism formed inside the lid.

Next, the construction of a pod according to still another embodiment of the present invention will be described with reference to the figures. FIG. 13 is a schematic sectional view of an article accommodating container according to the present invention, that is, a pod. FIG. 14 is a bottom view of a main body of the pod with its lid having been removed. FIG. 15 is a bottom view of the pod with its lid fitted thereto, partially showing an internal structure thereof. In those figures, components performing operations similar to those of the components described in the conventional art will be described using the same reference symbols as used in FIGS. 9 to 11. The load port and the like described in the conventional art with reference to FIG. 10 are employed.

(Shape of Pod)

The pod 2 according to the present invention is composed of the main body 2a and the lid 2b. The main body 2a has an outward appearance of a generally cubic shape having a generally tubular first inner space 111a and a generally cubic second inner-space 111b formed therein. The first inner space 111a assumes a circular shape or a generally rectangular shape whose four corners each are formed of a part of a circular arc having an arbitrary diameter when viewed from above. The second inner space 111b continues to the first inner space 111a below the first inner space 111a. The first inner space 111a has a size large enough to accommodate an article to be held therein, in this case, the reticle (or substrate) 9 having a contour indicated by a chain double-dashed line in the figure. The main body 2a has on its lateral portion a brim portion 112 used in transferring the pod. A circular window portion 113 for observing an inner space, to which a glass or the like is fixed to maintain airtightness of the inner space, is arranged on the upper face of the main body 2a.

A plurality of work holding-down pins 114 extending downward from above to restrict the vertical movement of the reticle are arranged at equal intervals in the circumferential direction of the reticle in the first inner space 111a. The work holding-down pins 114 are in contact at their protruding tip portions with the reticle so as to reduce the area of contact with the reticle. Each of the work holding-down pins 114 is fixed to the main body 2a via a support member 114b so as to prevent an excessive load from being applied to the reticle. The second inner space 111b has a size large enough to accommodate the later-described lid 2b and groove portions 115, which will be described later, formed in two opposed lateral faces of the second inner space 111b.

A work guide 116 and work pins 117 are provided on the upper face of the lid 2b, which is on the main body 2a side in closing the main body 2a. The work guide 116 has a generally annular shape allowing insertion through the first inner space 111a. A guide portion 116a for guiding an outer periphery portion of the reticle in the inner space on all four sides protrudes from an outer periphery portion of an upper face of the work guide 116. The work pins 117 are arranged so as to be substantially opposed to the aforementioned work holding-down pins 114, and their tip portions support the reticle. An O-ring 118 is arranged along an outer periphery of the work guide 116 on the upper face of the lid 2b. The O-ring 118 is in tight contact with a face 111c defining an upper face of the second space 111b, so the first space 111a defined by the main body 2a and the lid 2b is sealed up.

The pod 2 according to the present invention keeps the pressure in the first space 111a lower than an ambient pressure (atmospheric pressure), thereby holding the main body 2a and the lid 2b while ensuring firm contact therebetween. In the pod 2, the first space 111a maintained as a depressurized space has a generally circular cross-sectional shape. As a result, the pod 2 becomes robust against a load resulting from the atmospheric pressure even when there is a great difference between the pressure in the space and the ambient pressure or when the cross-sectional area of the inner space has increased. It is easy to form the pod 2 assuming this shape from a metal such as aluminum, and it is also easy to subject an inner surface thereof to an electrolytic polishing treatment. Generation of particles from the inner surface of the pod or the like can be suppressed by performing the treatment.

(Falloff Preventing Mechanism)

Next, a falloff preventing mechanism, which is a component added to the pod according to the present invention as a countermeasure against a case where the state of tight contact between the main body 2a and the lid 2b is broken through a loss of the depressurized state in the aforementioned first space 111a, will be described in detail. A falloff preventing mechanism 120 for preventing the lid 2b from falling off is arranged inside the lid 2b. The falloff preventing mechanism is composed of a cam plate 121 in the shape of a circular plate, falloff preventing plates 124, and preventing plate holders 126. The cam plate 121 is turnably arranged substantially at a central position of the lid 2b. Engagement holes 121a arranged on arbitrary positions on a circumference of a circle spreading around the center of the rotary cam plate 121 are formed therethrough. It is preferable that the engagement holes 121a are circular holes arranged point-symmetrically on the circumference of the circle.

The engagement holes 121a, with which the latch pins 32 of the load port portion 10 are engaged, are shaped so as to be able to receive the latch pins 32 and arranged so as to correspond in position to the latch pins 32. Two cam grooves 123 located point-symmetrically with respect to the center of the cam plate 121 are arranged outside the engagement holes 121a of the cam plate 121. Given that each of the cam grooves 123 has one end as a starting point 123a and the other end as an end point 123b, the distance between the starting point 123a of the cam groove 123 and the center of the cam plate 121 is the shortest, whereas the distance between the center of the cam groove 123 on the end point 123b side of the cam groove 123 and the center of the cam plate 121 is the longest.

Each of the falloff preventing plates 124 is constructed of a generally rod-like member extending on a line connecting the center of the cam plate 121 to substantially central portions of the groove portions 115 provided in the main body 2a. Each of the preventing plate holders 126 is constructed of a plate-like member extending parallel to the direction in which the falloff preventing plates 124 extend. The preventing plate holders 126 are fixed to the lid 2b and support the falloff preventing plates 124 via two bushes 125 such that the falloff preventing plates 124 can be driven in the direction in which they extend. Driven pins 127 are fixed to end portions of the falloff preventing plates 124 on the cam plate 121 side. The driven pins 127 are inserted into the cam grooves 123 in a penetrating manner. Spring members 128 are arranged around spaces between the two bushes 125 of the falloff preventing plates 124. Stoppers 128a fixed to the falloff preventing plates 124 restrict the movement of the spring members 128 in the direction in which the falloff preventing plates 124 extend. Owing to loads applied from the spring members 128 in the direction in which the falloff preventing plates 124 extend, the falloff preventing plates 124 are prevented from trembling at respective positions along their movements and causing vibrations or the like.

When the lid 2b is laid on the load port portion 10, the latch pins 132 protruding above the surface of the port door 3 are fittingly inserted into the latch holes 121a. When the rotary shaft 133 is rotated in this state, the cam plate 121 rotates together with the latch pins 132, and each of the driven pins 127 at the end of the falloff preventing plate 124 moves from the starting point 123a toward the end point 123b of a corresponding one of the cam grooves 123. That is, the driven pins 124 move outward from the center of the rotary cam plate 121, along the direction in which the falloff preventing plates 124 extend. In accordance with the movements of the driven pins 127, tip portions 124a of the falloff preventing plates 124 move toward the outside of the lid 2b. The tip portions 124a are set to be confined within the lid 2b when each of the driven pins 127 is located at the cam groove starting point 123a, and to protrude from the lid 2b when each of the driven pins 127 is located at the cam groove end point 123b.

As described above, the groove portions 115 are formed at the positions corresponding to the tip portions 124a of the falloff preventing plates 124 in the main body 2a of the clean box 2. The tip portions 124a are located within the groove portions 115 when they protrude outside the lid 2b. The width, height, and depth of the groove portions 115 are set such that the tip portions 124a do not come into contact with any part in the inside of the groove portions 115 in performing a normal operation. Accordingly, no particles or the like are generated as a result of the falloff preventing member according to the present invention, especially the tip portions 124a of the falloff preventing plates 124. In other words, only when the depressurized state of a space operating to keep the main body 2a and the lid 2b in tight contact with each other is broken, the falloff preventing member operates to prevent the tip portions 124a and inner walls of the groove portions 115 from being substantially separated from each other through mutual contact and engagement therebetween.

MODIFIED EXAMPLE

Figure 16A:
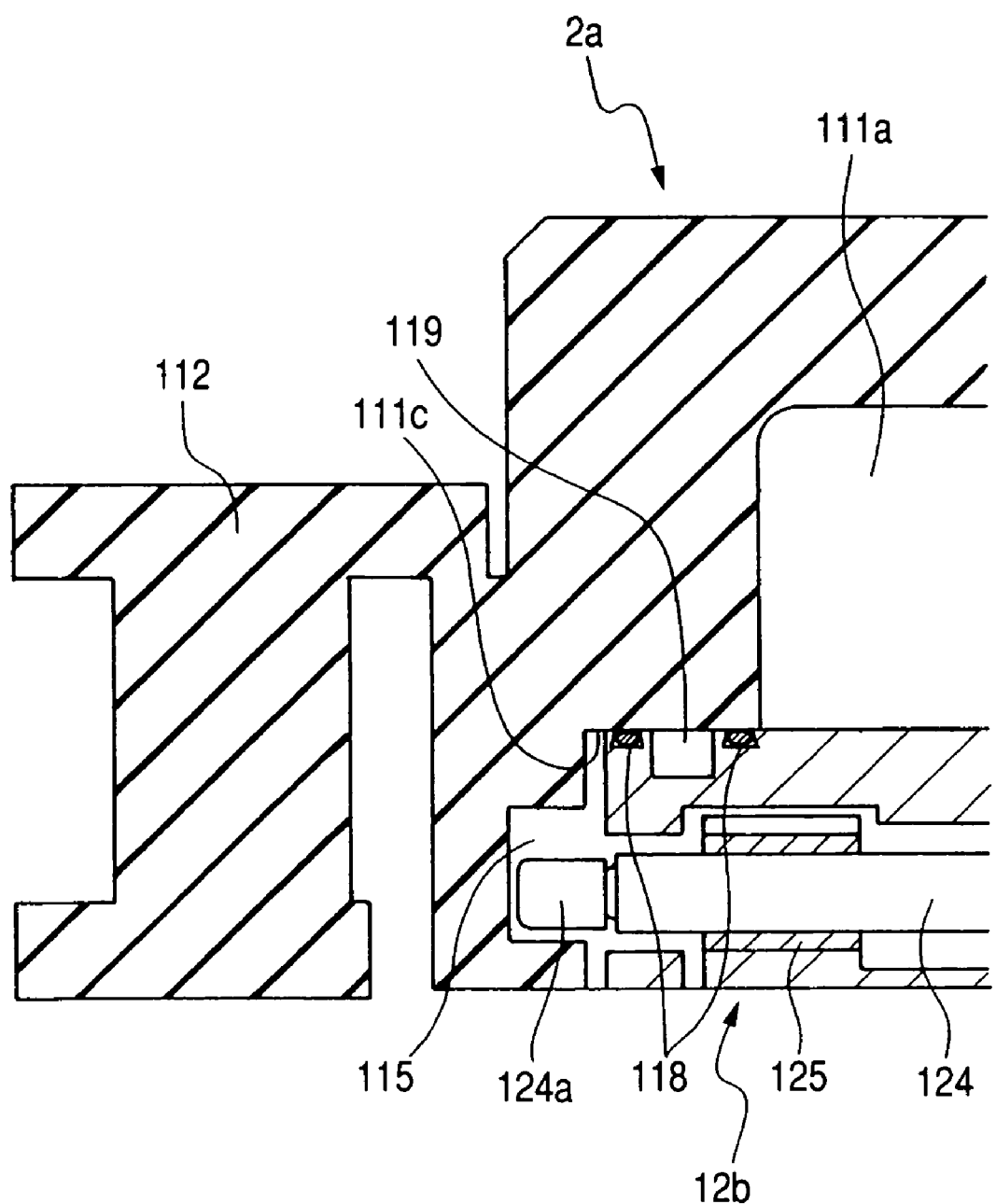
FIG. 16A is an enlarged sectional view of a main part of a pod according to still another embodiment of the present invention.
Figure 16B:
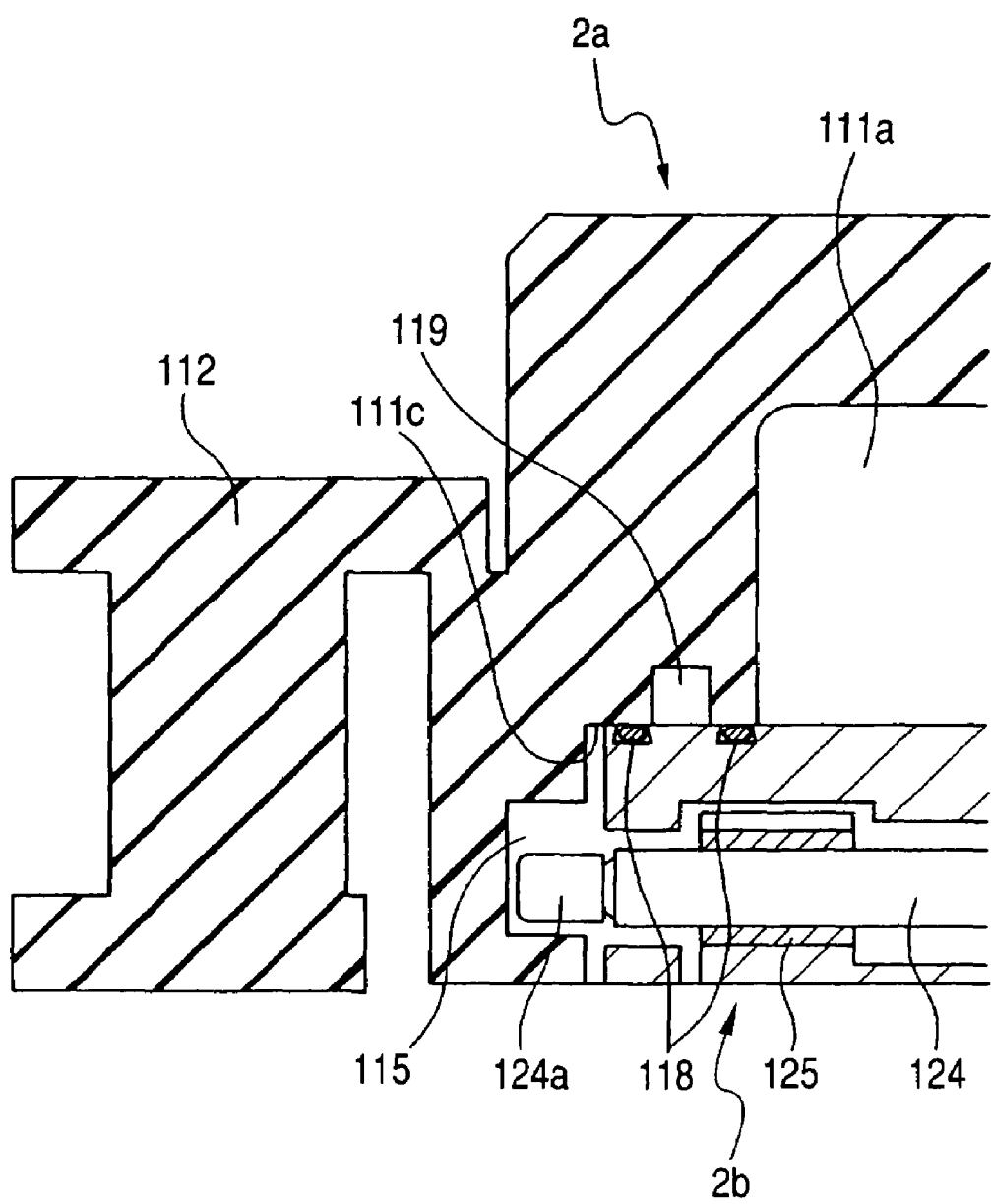
FIG. 16B is an enlarged sectional view of a main part of a pod according to still another embodiment of the present invention.

Next, a modified example of the pod according to another embodiment of the present invention will be described. Components achieving the same operations and effects as those of the components described in the foregoing embodiment will be described using the same reference symbols. Each of FIGS. 16A and 16B is an enlarged sectional view showing an essential part of the pod 2 in this embodiment. In this embodiment, the lid 2b is kept in tight contact with the main body 2a not by depressurizing the inner space 111a but by depressurizing a space 119 provided to keep them in tight contact with each other. FIG. 16A shows a case where the space 119 is formed in a region of the lid 2b opposed to the face 111c. FIG. 16B shows a case where the space 119 is formed in the face 111c. To seal up the space, O-rings 118 are arranged in inner and outer peripheral portions of the space 119 having a generally annular shape at such positions as to allow tight contact with the face 111c.

By thus providing the dedicated space 119 operating to keep the main body 2a and the lid 2b in tight contact with each other, it becomes possible to hold the pressure in the first inner space 111a substantially equal to or higher than the atmospheric pressure using, for example, dry nitrogen. The lid 2b can be prevented from separating from the main body 2a due to the operation of the falloff preventing mechanism even if the depressurized state of the space 119 has been broken. Therefore, in comparison with the conventional SMIF type pod, a reticle and the like can be held inside under the condition of a wider pressure range. The present invention also makes it possible to completely eliminate the phenomena of engagement, abrasion, and the like of the latch member and the like as is inevitably the case with the conventional SMIF type pod. Thus, the amount of particles and the like generated at the time when the main body 2a and the lid 2b are kept in tight contact with each other can be reduced drastically.

In the foregoing embodiment, the tip portion of the falloff preventing member is caused to protrude outside the lid 2b by rotating the cam plate in the shape of a circular disc and transmitting this rotational movement to the falloff preventing member via a cam mechanism. However, various known mechanisms can be employed as a drive mechanism for the falloff preventing member as long as its tip portion can be driven reciprocally. In other words, the falloff preventing member can adopt various constructions as long as a part of the falloff preventing member can protrude from the outer periphery portion of the lid when the lid is in tight contact with the main body. The groove portions provided on the main body 2a side to accommodate the tip portion of the falloff preventing member are not limited in shape to those of this embodiment either. The groove portions can assume various shapes as long as an inner volume for preventing contact between the tip portion of the falloff preventing member and inner peripheral faces of the groove portions is ensured when the falloff preventing member is normally driven. It is also appropriate to arrange elastic members made of rubber or the like on the inner peripheral faces to absorb an impact caused, for example, when the lid falls off.

In this embodiment, the falloff preventing member protrudes in such a direction that the falloff preventing member protrudes between the horizontally opposed faces provided on the main body and the lid, respectively, and the groove portions are provided in those opposed faces. However, the embodiment of the present invention is not limited to this construction. It is also acceptable to adopt a construction in which the falloff preventing member protrudes toward a face vertically opposed thereto, for example, the face 111c and a protruding portion of the falloff preventing member, after having protruded into a groove portion provided in the face 111c, can be engaged with a part of the groove portion. More specifically, a hook-like portion may be provided at the tip of the protruding portion to be rotated within the groove portion to allow engagement. Alternatively, the hook-like portion may further protrude from the tip portion after having been arranged within the groove portion.

According to the present invention, the depressurized space formed inside the main body of the pod and the lid serves to ensure tight contact therebetween. The falloff preventing mechanism for preventing the lid from falling off usually does not perform engagement accompanied with friction or the like with the main body portion but comes into contact with a part of the main body portion only when the depressurized state of the depressurized space is broken. In addition, it is not absolutely required that the depressurized space is the article accommodating space within the pod. That is, the depressurized space may be formed for the sole purpose of ensuring tight contact. By adopting this construction, it becomes possible to drastically reduce the amount of particles and the like generated as a result of the construction for actually performing the operations of sealing and the like, in performing the operation of sealing or opening the main body of the pod by means of the lid.

Since the falloff preventing mechanism has been added, an accident such as falloff of the lid separated from the main body can be prevented even when the depressurized state of the depressurized space has been broken. Moreover, the falloff preventing mechanism according to the present invention can be substantially composed of the same elements as those constituting a so-called latch mechanism used in fixing the lid to the pod in the conventional art, and can be directly applied to the conventional load port or the like.

The main body of the pod according to the present invention is structured such that the space for actually accommodating an accommodated article such as a reticle has a generally circular cross-sectional shape. Thus, the resistance against a differential pressure between the outside and inside of the container is enhanced, so the container can be used as a robust vacuum container. It is easy to form the pod assuming this shape from a metal, and it is possible to easily subject the inside thereof to a treatment of suppressing generation of particles, such as an electrolytic polishing treatment.

The invention claimed is:

1. An opening/closing mechanism arranged in a substrate processing device, which detaches a lid from a main body of a SMIF type clean box including the main body and the lid on which the substrate is loaded, so as to execute the processing on the substrate processing device, and detachably attaches the lid which is located at a bottom portion of the main body, to an opening provided at the bottom portion of the main body, wherein the lid of the clean box includes a cam plate and a latch member that moves to protrude from the lid and to be drawn into the lid, by a rotation of the cam plate, and the main body includes a latch hole for receiving the latch member protruding from the lid so as to lock the lid to the main body, and the opening/closing mechanism includes a port door on which the lid of the clean box is mounted, a raising/lowering device which executes the raising/lowering of the port door and includes a rotating shaft having a latch pin for rotating the cam plate and having a protrusion fittingly inserted into a non-circular shaped receiving hole provided onto the lid, and the latch pin is located at a position displaced from the protrusion and wherein the protrusion at the rotating shaft is inserted into the non-circular shaped receiving hole, the port door and the lid are coupled therewith by rotating the rotating shaft to engage the protrusion with the non-circular shaped receiving hole and thereby the raising/lowering device exerts a down force onto the lid, the lid of the clean box mounted on and coupled with the port door is vertically lowered to be detached from the main body by vertically lowering the port door by the raising/lowering device, and the substrate loaded onto the lid is lowered at a predetermined height to be processed.

2. The opening/closing mechanism according to claim 1, wherein the protrusion includes a brim portion at a tip thereof; and the brim portion is engaged with a seat of the non-circular shaped receiving hole by a rotation of the rotating shaft.

3. The opening/closing mechanism according to claim 2, wherein a an operation to move the latch member to protrude from the lid and an engagement between the brim portion of the protrusion and the seat of the non-circular shaped receiving hole are simultaneously executed by the rotation of the rotating shaft, and an operation to draw the latch member into the lid and a releasing of the engagement between the brim portion of the protrusion and the seat of the non-circular shaped receiving hole are simultaneously executed by a second rotation of the rotating shaft.

4. The opening/closing mechanism according to claim 1, wherein the rotating shaft is vertically movable independent from the raising/lowering device, the protrusion includes a brim portion at a tip portion thereof and a root portion of which cross-sectional area is smaller than that of the brim portion, the rotating shaft is rotated in a state that a surface configuring a seat of the non-circular shaped receiving hole faces to a surface of the brim portion with an interval, and the rotating shaft is lowered to engage the brim portion of the protrusion with the seat of the non-circular shaped receiving hole.

5. The opening/closing mechanism according to claim 4, wherein a protruding operation and a being drawn operation of the latch member, and an engagement and a releasing of the engagement between the brim portion of the protrusion and the seat of the non-circular shaped receiving hole are simultaneously executed by the rotation of the rotating shaft.

6. The opening/closing mechanism according to claim 1, wherein the raising/lowering device includes an actuator and a latch open/close shaft, and the latch open/close shaft is vertically driven by the actuator to raise or lower the port door, and the rotating shaft is located inside the latch open/close shaft.

* * * * *